(12) United States Patent
Kagaya et al.

(10) Patent No.: US 8,247,896 B2
(45) Date of Patent: *Aug. 21, 2012

(54) STACKED SEMICONDUCTOR DEVICE AND FABRICATION METHOD FOR SAME

(75) Inventors: Yutaka Kagaya, Chuo-ku (JP); Hidehiro Takeshima, Chuo-ku (JP); Masamichi Ishihara, Ktakyushu (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/875,799

(22) Filed: Sep. 3, 2010

(65) Prior Publication Data

US 2011/0001235 A1    Jan. 6, 2011

Related U.S. Application Data

(62) Division of application No. 11/734,054, filed on Apr. 11, 2007, now Pat. No. 7,808,093.

(30) Foreign Application Priority Data

Apr. 17, 2006    (JP) .................................. 2006-113529

(51) Int. Cl.
   *H01L 23/02*    (2006.01)

(52) U.S. Cl. .. 257/686; 257/723; 257/777; 257/E25.013

(58) Field of Classification Search .................. 257/676, 257/686, 723, 777, 778, E25.013, E25.023
See application file for complete search history.

(56) References Cited

U.S. PATENT DOCUMENTS

| | | | |
|---|---|---|---|
| 6,902,951 B2 | 6/2005 | Goller et al. | |
| 7,235,871 B2* | 6/2007 | Corisis | 257/686 |
| 7,456,495 B2 | 11/2008 | Pohl et al. | |
| 7,550,857 B1 | 6/2009 | Longo et al. | |
| 7,808,093 B2* | 10/2010 | Kagaya et al. | 257/686 |

(Continued)

FOREIGN PATENT DOCUMENTS

JP    2004-172157 A    6/2004

(Continued)

OTHER PUBLICATIONS

Japanese Office Action issued on Sep. 1, 2011 in corresponding Japanese Application No. 2006-113529.

*Primary Examiner* — Tuan N. Quach
(74) *Attorney, Agent, or Firm* — Sughrue Mion, PLLC

(57) ABSTRACT

A stacked semiconductor device is constructed by stacking in two levels: a lower semiconductor device having a wiring board, at least one semiconductor chip mounted on a first surface of the wiring board and having electrodes electrically connected to wiring by way of a connection means, an encapsulant composed of insulating plastic that covers the semiconductor chip and the connection means, a plurality of electrodes formed overlying the wiring of a second surface of the wiring board, and a plurality of linking interconnects each having a portion connected to the wiring of the first surface of the wiring board and another portion exposed on the surface of the encapsulant; and an upper semiconductor device in which each electrode overlies and is electrically connected to the exposed portions of each of the linking interconnects of the lower semiconductor device. The linking interconnects extend from the first surface of the wiring board to the side surfaces and upper surface of the encapsulant, and moreover, electrically connect with wiring of the wiring board that projects from the encapsulant.

17 Claims, 19 Drawing Sheets

U.S. PATENT DOCUMENTS

| | | |
|---|---|---|
| 2002/0145178 A1* | 10/2002 | Tsao et al. .................... 257/620 |
| 2004/0061213 A1* | 4/2004 | Karnezos ...................... 257/686 |
| 2005/0148113 A1 | 7/2005 | Karnezos |
| 2006/0128062 A1 | 6/2006 | Doescher |
| 2007/0045796 A1 | 3/2007 | Ye et al. |
| 2007/0096291 A1 | 5/2007 | Kawabata et al. |
| 2007/0155048 A1 | 7/2007 | Lee et al. |
| 2007/0241437 A1 | 10/2007 | Kagaya et al. |
| 2008/0105965 A1* | 5/2008 | Song et al. .................... 257/686 |

FOREIGN PATENT DOCUMENTS

| | | |
|---|---|---|
| JP | 2004-273938 A | 9/2004 |
| JP | 2004266271 A | 9/2004 |
| JP | 2005203497 A | 7/2005 |
| JP | 2005317861 A | 10/2005 |
| TW | I400587 B | 1/2000 |

* cited by examiner

STACKED SEMICONDUCTOR DEVICE AND FABRICATION METHOD FOR SAME

This is a Divisional Application of U.S. patent application Ser. No. 11/734,054 filed Apr. 11, 2007, now U.S. Pat. No. 7,808,093, which claims priority to Japanese Patent Application No. 2006-113529 filed Apr. 17, 2006, the disclosures of which are incorporated here in their entirety by reference.

BACKGROUND OF THE INVENTION

1. Field of the Invention

The present invention relates to a semiconductor device and a method of fabricating the device. In particular, the present invention relates to a technology effective for application to the fabrication technology of stacked semiconductor devices in which a semiconductor device is stacked on the upper surface of a semiconductor device.

2. Description of the Related Art

Surface-mount semiconductor devices referred to as BGA (Ball Grid Array) constructions and LGA (Land Grid Array) are known in the art as package configurations for realizing semiconductor devices of greater integration as well as smaller size and lighter weight.

In this type of semiconductor device, semiconductor elements (semiconductor chips) are affixed to a wiring board. In this type of semiconductor device, the electrodes of semiconductor chips and connection pads that are formed by the wiring of the wiring board are connected by conductive wires (connection means). The semiconductor device is further of a configuration in which the semiconductor chips and wiring are covered by an encapsulant composed of insulating plastic.

To improve productivity, a fabrication method is adopted that employs the so-called blanket molding. In this fabrication method, a wiring mother board is prepared in which product formation areas for fabricating semiconductor devices are aligned horizontally and vertically. In this fabrication method, a semiconductor chip is affixed to each product forming part and wire connections then constructed. In this fabrication method, the entire wiring mother board is covered by an insulating plastic, following which the wiring motherboard is cut vertically and horizontally together with the plastic to produce a plurality of semiconductor devices. As the connection means, a method also exists in which each electrode of a semiconductor chip is flip-chip connected to connection pads of the wiring board.

As another method for realizing semiconductor devices of greater integration and smaller size, Japanese Patent Laid-open Publication No. 172157/2004 or Japanese Patent Laid-open Publication No. 273938/2004 adopt methods of stacking semiconductor chips on which, for example, ICs have been formed, or stacking semiconductor devices that have been packaged.

The present inventors have investigated the fabrication of the so-called "package-on-package" stacked semiconductor devices that employ solder balls (external electrode terminals) that are provided on the lower surface of a wiring board to stack packaged semiconductor devices.

Plastic-encapsulated semiconductor devices are typical well-known semiconductor devices. Semiconductor chips are mounted on these semiconductor devices on the upper surface of a wiring board having external electrode terminals on its lower surface. In these semiconductor devices, moreover, the electrodes of the semiconductor chips are electrically connected to the wiring of the wiring board by way of a connection means. The semiconductor devices are further of a configuration in which the semiconductor chip and the connection means are covered by an encapsulant (package) composed of insulating plastic.

When semiconductor devices of this type are stacked, the peripheral portion of the wiring board is caused to protrude to expose a portion of the wiring outside of the encapsulant. A method of fabricating a stacked semiconductor device can then be considered in which these exposed portions of wiring connect with the external electrode terminals (solder bumps) of the semiconductor device (upper semiconductor device) that is stacked on this exposed portion of wiring.

Arranging and stacking two levels of semiconductor chips on the package of the lower semiconductor device in this type of configuration increases the height of the package, and as a result, a bump electrode formed by one solder ball no longer has sufficient height. However, a method can be considered in which a substrate for stacking is arranged in between and solder balls then attached to the upper and lower sides of this substrate to electrically connect the upper and lower semiconductor devices.

However, in a stacked semiconductor device having this type of construction, the height of the stacked semiconductor devices increases and thus complicates the realization of thinner stacked semiconductor devices. In addition, the need for the portion of the wiring board outside of the package for connecting bump electrodes further complicates the realization of smaller stacked semiconductor devices.

SUMMARY OF THE INVENTION

It is an object of the present invention to provide a thin, stacked semiconductor device.

It is another object of the present invention to provide a compact stacked semiconductor device.

The above-described objects and other objects and novel features of the present invention will become clear from the description and accompanying drawings of the present specification.

A brief explanation of a summary of the representative features of the present invention disclosed in the instant application follows below.

1. A stacked semiconductor device comprising:
   a wiring board having wiring of a prescribed pattern on a first surface and second surface that is the surface opposite the first surface, wherein a portion of the wiring of the first and second surfaces is connected by wiring that passes between the first surface and second surface;
   at least one semiconductor chip mounted on the first surface of the wiring board, and further, having electrodes that are electrically connected to the wiring of the wiring board by way of a connection means;
   an encapsulant composed of insulating plastic formed on the first surface of the wiring board and that further covers the semiconductor chip and the connection means;
   a plurality of electrodes formed overlying the wiring of the second surface of the wiring board;
   a lower semiconductor device wherein
   the encapsulant being formed on a portion of the wiring board and of a construction having an upper surface and side surfaces joined to the upper surface and extending to the first surface;
   a portion of the wiring of the first surface of the wiring board projecting from the encapsulant and exposed;
   and having a plurality of linking interconnects extending from the first surface of the wiring board and over the side surfaces and the upper surface of the encapsulant, and further, electrically connecting to the exposed wiring that projecting from the encapsulant; and an upper semiconductor device wherein each of the electrodes overlies and electrically connects with a portion of each of the linking interconnects that are located on the upper surface of the lower semiconductor device.

In addition, in the lower semiconductor device, a first semiconductor chip is mounted on the first surface of the wiring board, and the second semiconductor chip is mounted on the first semiconductor chip with an insulating adhesive interposed.

This semiconductor device is fabricated by a fabrication method having the following steps.

The lower semiconductor device being fabricated by steps of:
- (a) preparing a semiconductor chip having a first surface and a second surface that is the surface opposite the first surface and having a plurality of electrodes on the first surface;
- (b) preparing a wiring mother board wherein:
  product formation areas are formed aligned horizontally and vertically, these product formation areas having wiring of a prescribed pattern on a first surface and a second surface that is the surface opposite the first surface, portions of the wiring of the first and second surfaces being connected by wiring that passes between the first surface and second surface;
  the wiring of the first surface of the product formation areas has connection pads that are electrically connected to each of the electrodes of the semiconductor chip by way of a connection means; and
  the wiring of the second surface of the product formation areas has a plurality of terminal formation pads;
- (c) mounting the semiconductor chip on the first surface of each of the product formation areas of the wiring mother board and electrically connecting each of the electrodes of the semiconductor chip to each of the connection pads by way of a connection means;
- (d) forming an encapsulant composed of insulating plastic and having an upper surface and side surfaces that are joined to the upper surface and that extend as far as the first surface of the product formation areas, the encapsulant covering the semiconductor chip and the connection means while leaving a portion of the wiring of the first surface exposed on the first surface of each of the product formation areas of the wiring mother board;
- (e) forming a plurality of linking interconnects that extend from the first surface of each of the product formation areas of the wiring mother board and over the side surfaces and the upper surface of the encapsulant, and moreover, that are electrically connected to a portion of the wiring that projects and is exposed from the encapsulant;
- (f) forming external electrode terminals on the terminal formation pads of the second surface of each of the product formation areas of the wiring mother board; and
- (g) cutting and segmenting the wiring mother board along the border lines of each of the product formation areas; and an upper semiconductor device being fabricated by steps of:
- (h) preparing a semiconductor chip having a first surface and a second surface that is the surface opposite the first surface and further having a plurality of electrodes on the first surface;
- (i) preparing a wiring mother board wherein:
  product formation areas are formed aligned horizontally and vertically having wiring of a prescribed pattern on a first surface and a second surface that is the surface opposite the first surface and wherein portions of the wiring of the first and second surfaces are connected by wiring that passes between the first surface and second surface;
  the wiring of the first surface of the product formation areas has connection pads that are electrically connected to each of the electrodes of the semiconductor chip by way of a connection means; and
  the wiring of the second surface of the product formation areas has a plurality of terminal formation pads provided to correspond to the portions of the linking interconnects on the upper surface of the encapsulant of the lower semiconductor device;
- (j) mounting the semiconductor chip on the first surface of each of the product formation areas of the wiring mother board, and further, electrically connecting each of the electrodes of the semiconductor chip to the connection pads by way of a connection means;
- (k) forming an encapsulant composed of insulating plastic that covers the semiconductor chip and the connection means on the first surface of each of the product formation areas of the wiring mother board;
- (l) forming external electrode terminals on the terminal formation pads of the second surface of each of the product formation areas of the wiring mother board; and
- (m) cutting and segmenting the wiring mother board or the wiring mother board and encapsulant along border lines of each of the product formation areas; and fabricating a stacked semiconductor device in which two semiconductor device are stacked in two levels by a step of:
- (n) overlaying the external electrode terminals of the upper semiconductor device on the portions of each of the linking interconnects that are located on the upper surface of the encapsulant of the lower semiconductor device and connecting the external electrode terminals and the portions of the linking interconnects.

In the fabrication step of the linking interconnects in the above-described Step (e), the linking interconnects are formed by steps of:
- (1) curving a one-layer mask that is provided with slits that correspond to the linking interconnects over the first surface of each of the product formation areas of the wiring mother board such that the mask overlies and closely adheres to the first surface and the side surfaces and upper surface of the encapsulant;
- (2) applying ink that contains metal particles to a uniform thickness over the entire area of the first surface of each of the product formation areas of the wiring mother board;
- (3) removing the mask from the wiring mother board such that the form of the ink filling the slits of the mask is not damaged; and
- (4) curing the ink that remains on the wiring mother board and the encapsulant.

2. In the means of the above-described "1," the portions of the linking interconnects that overlie the encapsulant are formed in trenches provided from the side surfaces and across the upper surface of the encapsulant.

In a semiconductor device of this type, the linking interconnects are formed by processes of:

in the step of forming the encapsulant of the above-described Step (d), using a mold die provided with projections corresponding to the linking interconnects on the wall surfaces of cavities that are filled with plastic to form the encapsulant and selectively form trenches on the side surfaces and upper surface of the encapsulant; and in the step of forming linking interconnects in the above-described Step (e), filling the trenches provided in the surface of the encapsulant with ink containing metal particles and then subjecting the ink to a curing process.

3. In the means of the above-described "1," a protective layer composed of insulating plastic is formed on the lower semiconductor device, this protective layer covering the portions of the linking interconnects on the first surface side of the wiring board and reaching from the side surfaces of the encapsulant to the outer periphery of the wiring board.

A semiconductor device of this type is produced by the fabrication method having the steps described hereinbelow.

The lower semiconductor device is fabricated by steps of:
(a) preparing a semiconductor chip having a first surface and a second surface that is the surface opposite this first surface and having a plurality of electrodes on the first surface;
(b) preparing a wiring mother board wherein:
  product formation areas are formed aligned horizontally and vertically, these product formation areas having wiring of prescribed patterns on a first surface and a second surface that is the surface opposite this first surface, a portion of the wiring of the first and second surfaces being connected by wiring that passes between the first surface and second surface;
  the wiring of the first surface of the product formation areas has connection pads for electrically connecting to each of the electrodes of the semiconductor chip by way of a connection means; and
  the wiring of the second surface of the product formation areas has a plurality of terminal formation pads;
(c) mounting the semiconductor chip on the first surface of each of the product formation areas of the wiring mother board, and further, electrically connecting each of the electrodes of the semiconductor chip to each of the connection pads by way of the connection means;
(d) forming an encapsulant composed of insulating plastic on the first surface of each of the product formation areas of the wiring mother board that covers the semiconductor chip and the connection means while leaving a portion of the wiring of the first surface exposed, this encapsulant having an upper surface and side surfaces that join the upper surface and that extend to the first surface of the product formation areas;
(e) forming a plurality of linking interconnects that extend from the first surface of each of the product formation areas of the wiring mother board and as far as the side surfaces and upper surface of the encapsulant, and moreover, that are electrically connected to a portion of the wiring that projects and is exposed from the encapsulant;
(f) forming a protective layer composed of insulating plastic on the first surface of each of the product formation areas of the wiring mother board, this protective layer covering the portion of linking interconnects from the side surfaces of the encapsulant and reaching as far as the outer periphery of the product formation areas;
(g) forming external electrode terminals on the terminal formation pads of the second surface of each of the product formation areas of the wiring mother board; and
(h) cutting and segmenting the wiring mother board along the border lines of each of the product formation areas;
the upper semiconductor device is fabricated by steps of:
(i) preparing a semiconductor chip having a first surface and a second surface that is the surface opposite this first surface and having a plurality of electrodes on the first surface;
(j) preparing a wiring mother board wherein:
  product formation areas are formed aligned horizontally and vertically, these product formation areas having wiring of prescribed patterns on a first surface and a second surface that is the surface opposite this first surface, portions of the wiring of the first and second surfaces being connected by wiring that passes between the first surface and second surface;
  the wiring of the first surface of the product formation areas has connection pads that electrically connect to each of the electrodes of the semiconductor chip by way of a connection means; and
  the wiring of the second surface of the product formation areas has a plurality of terminal formation pads provided to correspond to the portions of the linking interconnects on the upper surface of the encapsulant of the lower semiconductor device;
(k) mounting a semiconductor chip on the first surface of each of the product formation areas of the wiring mother board and electrically connecting each of the electrodes of the semiconductor chip to the connection pads by way of a connection means;
(l) forming an encapsulant composed of insulating plastic that covers the semiconductor chip and the connection means on the first surface of each of the product formation areas of the wiring mother board;
(m) forming external electrode terminals on the terminal formation pads of the second surface of each of the product formation areas of the wiring mother board; and
(n) cutting and segmenting the wiring mother board or the wiring mother board and the encapsulant along the border lines of each of the product formation areas; and
a stacked semiconductor device in which two semiconductor devices are stacked in two levels is fabricated by a step of:
(o) overlaying the external electrode terminals of the upper semiconductor device on each of the portions of the linking interconnects located on the upper surface of the encapsulant of the lower semiconductor device and connecting the external electrode terminals and the portions of the linking interconnects.

A brief explanation of the effects obtained by a representative example of the present invention disclosed in the present application follows below.

According to the means described above in "1":
(a) In the lower semiconductor device, a portion of the wiring of the upper surface (first surface) of a wiring board on which an encapsulant is provided projects from the encapsulant and is exposed, and linking interconnects that electrically connect to this exposed wiring extend as far as and are positioned on the upper surface.

Electrodes of the lower surface (second surface) of the upper semiconductor device are of a construction that electrically connect to each portion of the linking interconnects on the upper surface of the encapsulant. When a plurality of semiconductor chips are mounted overlying each other within the encapsulant of the lower semiconductor device, the thickness of the encapsulant inevitably increases (increases in height).

However, the thickness (height) of the electrodes of the upper semiconductor device can be made thinner without affecting the thickness of the encapsulant of the lower semiconductor device because the electrodes are of a construction that overlies and connects to the portions of the linking interconnects provided on the upper surface of the encapsulant of the lower semiconductor device.

As a result, a stacked semiconductor device of thinner construction can be achieved. The electrodes of the upper semiconductor device are, for example, bump electrodes formed from solder balls. The diameter of these solder balls can be made on the order of 200-300 μm, thus enabling a stacked semiconductor device of thinner configuration.

(b) In the lower semiconductor device, a portion of the wiring of the upper surface of the wiring board that is provided with an encapsulant projects from the encapsulant and is exposed, whereby the outer periphery of the wiring board is of a configuration that protrudes outside the encapsulant.

The length of the protrusion of the wiring board that protrudes from the outer periphery of the encapsulant may be of any length that allows electrical connection between the wiring that is provided on the wiring board and the linking interconnects. As a result, the length of the protrusion of this outer periphery of the wiring board can be made shorter than a configuration in which bump electrodes are arranged, thus enabling the realization of a more compact stacked semiconductor device.

(c) The above-described (a) and (b) enable the achievement of a more compact and thinner stacked semiconductor device.

(d) A plurality of semiconductor chips can be mounted stacked on each of the lower semiconductor device and the upper semiconductor device, enabling a stacked semiconductor device of higher density and greater integration.

(e) The lower semiconductor device is of a configuration in which the connection portion (the portion of the linking interconnects) for realizing connection with an upper semiconductor device is arranged on the upper surface of the encapsulant, whereby restrictions on the arrangement of the connecting portion are eliminated, raising the degree of freedom of the design of the stacked semiconductor device.

(f) The preparation of a plurality of lower semiconductor devices having linking interconnects on the surface of the encapsulant enables the provision of a stacked semiconductor device having three or more layers of stacking.

In this case, the electrodes on the lower surface side of the middle semiconductor device overlie and connect with the linking interconnects of the semiconductor device below the middle semiconductor device. The portions of the linking interconnects of the upper surface of the encapsulant of the middle semiconductor device are of a configuration in which the electrodes of the semiconductor device above the middle semiconductor device overlie and connect with the linking interconnects.

A stacked semiconductor device constructed by the means of the above-described "2" has the following effects in addition to the effects constructed by the stacked semiconductor device of the above-described means (1).

In the lower semiconductor device, the portions of the linking interconnects that overlie the encapsulant are formed in trenches provided from the side surfaces and across the upper surface of the encapsulant. As a result, the height (thickness) of the protrusion of the linking interconnects that protrude on the upper surface of the encapsulant can be decreased compared to the case of the lower semiconductor device constructed by the means of the above-described "1." In this way, a stacked semiconductor device of even thinner construction can be achieved.

A stacked semiconductor device constructed by the means of the above-described "3" has the following effects in addition to the effect constructed by the stacked semiconductor device of the above-described means (1).

In the lower semiconductor device, the portions of the linking interconnects that extend from the side surfaces of the encapsulant as far as the outer periphery of the wiring board are covered and protected by a protective layer composed of insulating plastic, whereby short-circuit defects that occur when extraneous matter adheres to the wiring and linking interconnects can be prevented. The reliability of the stacked semiconductor device can thus be increased.

The above and other objects, features, and advantages of the present invention will become apparent from the following description with reference to the accompanying drawings, which illustrate examples of the present invention.

BRIEF DESCRIPTION OF THE DRAWINGS

FIGS. 10A, 10B, 100, 10D, and 10E are sectional views of a portion of the steps showing the method of fabricating a stacked semiconductor device of the first embodiment;

DETAILED DESCRIPTION OF THE PREFERRED EMBODIMENTS

First Embodiment

FIGS. 1 to 18 are figures relating to the stacked semiconductor device of the first embodiment of the present invention and to the fabrication method of this stacked semiconductor device. FIGS. 1 to 7 are figures relating to the construction of the stacked semiconductor device. FIGS. 8A, 8B, 8C, 8D, 8E, 8F to FIG. 18 are figures relating to the fabrication method of the semiconductor device.

The stacked semiconductor device of the present invention is a semiconductor device in which a plurality of semiconductor devices are stacked in multiple layers. In the first embodiment, explanation relates to a case in which the present invention is applied to a stacked semiconductor device in which two semiconductor devices are stacked.

Figure 1:
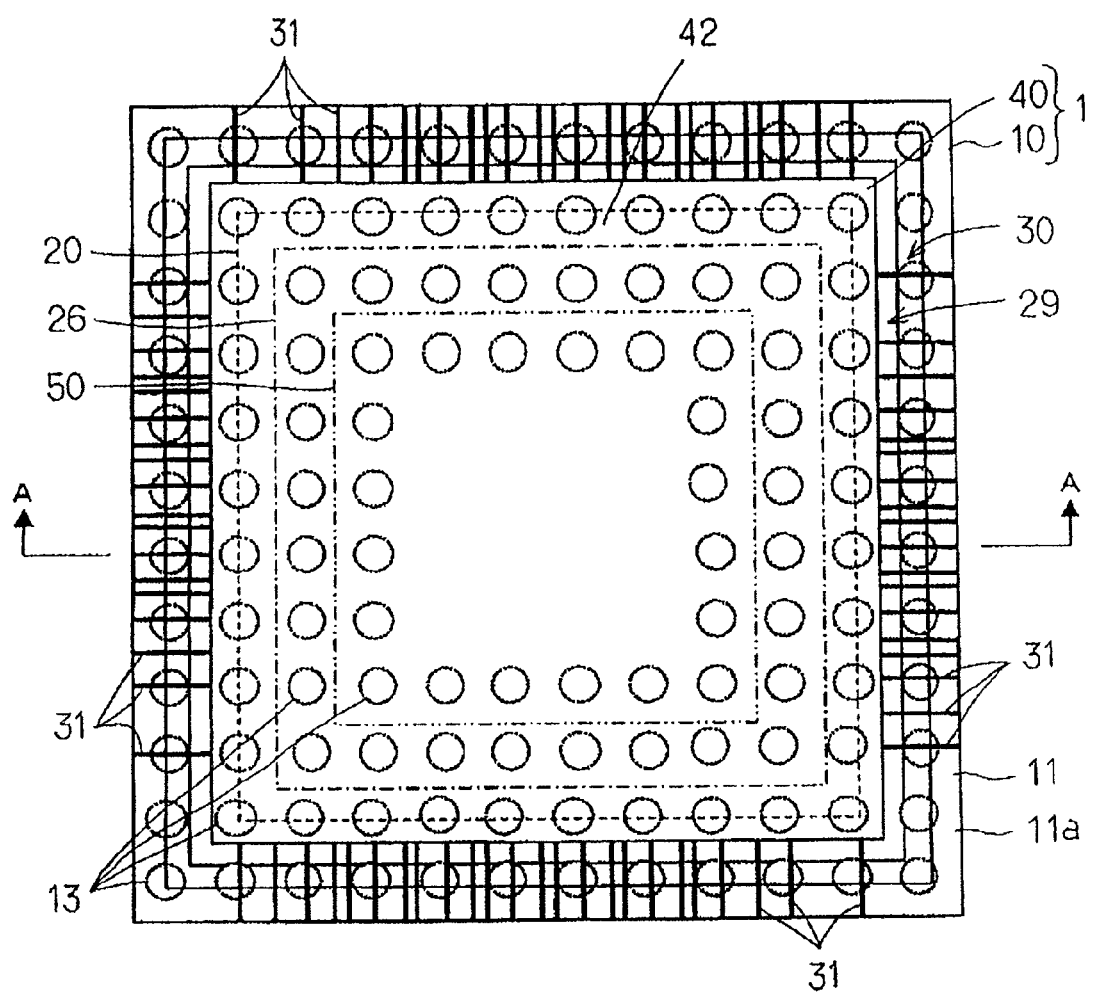
FIG. 1 is a plan view of a stacked semiconductor device that is the first embodiment of the present invention.
Figure 2:
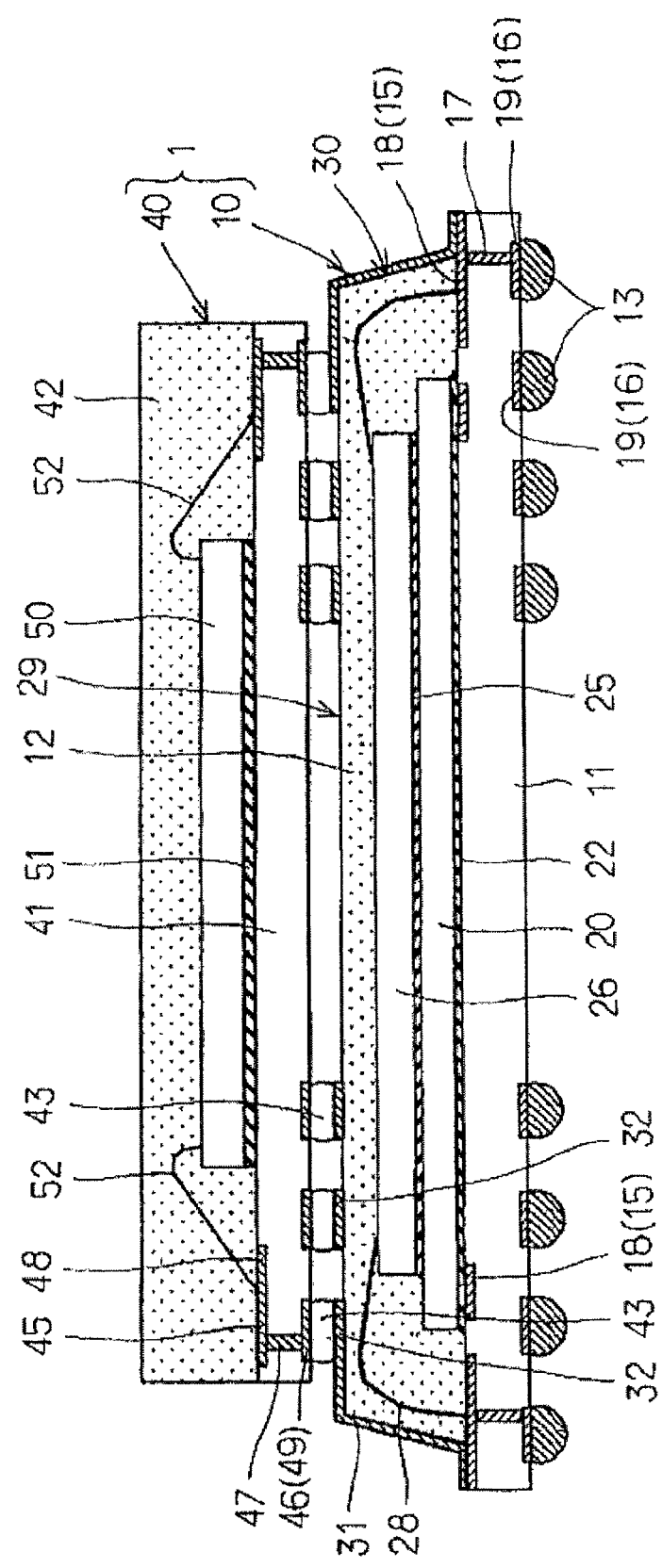
FIG. 2 is an enlarged sectional view taken along line A-A of FIG. 1.

As shown in FIGS. 1 and 2, stacked semiconductor device 1 of the first embodiment is made up of lower semiconductor device 10 and upper semiconductor device 40 that is stacked on this lower semiconductor device 10. Lower semiconductor device 10 is of a configuration having external electrode terminals on its lower surface that are to be mounted to the packaging substrate (wiring board) of various types of electronic devices and terminals on its upper surface to which connect the external electrode terminals of the lower surface of upper semiconductor device 40. A semiconductor device of this configuration is, for the sake of explanation, also referred to as "first semiconductor device 10." In upper semiconductor device 40, the only terminals that are provided exposed on the outside are external electrode terminals on the lower surface. For the sake of explanation, the semiconductor device of this configuration is referred to as second semiconductor device 40.

Figure 3:
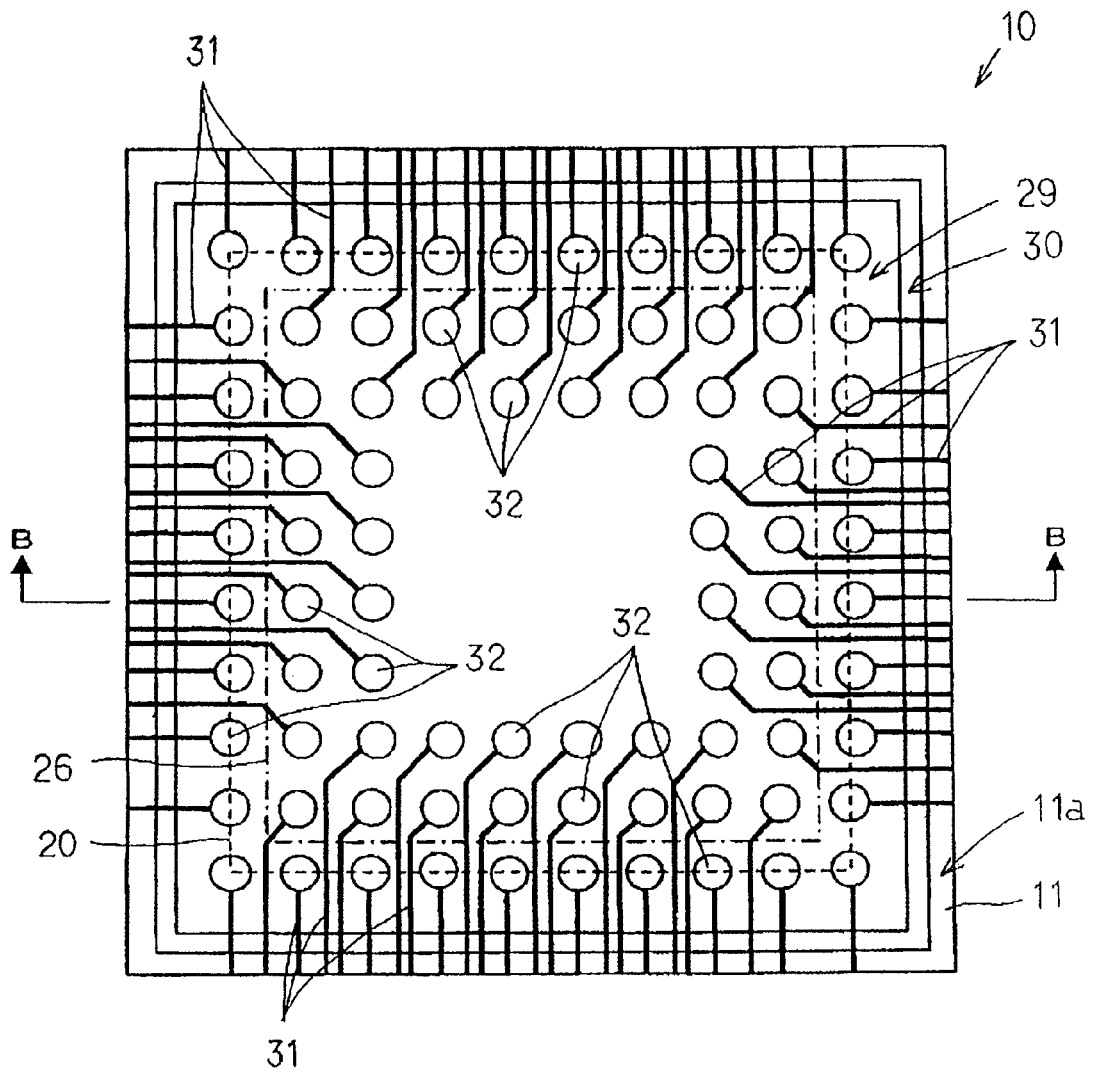
FIG. 3 is a plan view of the first semiconductor device that forms a part of the stacked semiconductor device of the first embodiment.
Figure 4:
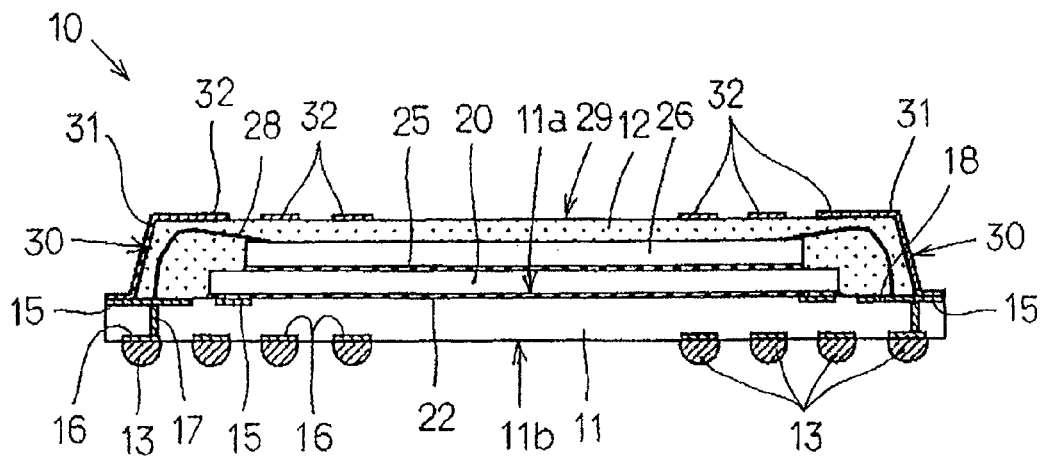
FIG. 4 is an enlarged sectional view taken along line B-B of FIG. 3.
Figure 5:
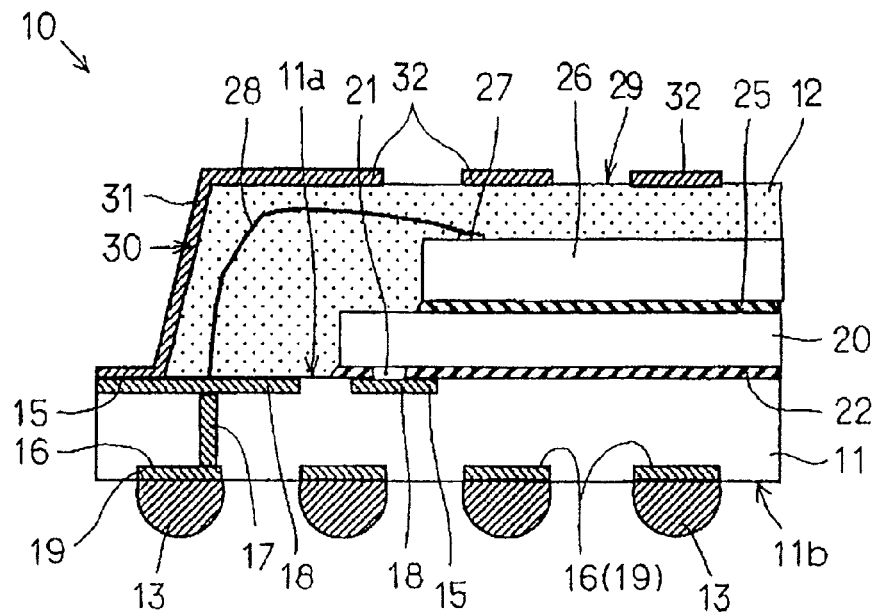
FIG. 5 is an enlarged sectional view showing a portion of FIG. 4.

As shown in FIGS. 3 to 5, lower semiconductor device (first semiconductor device) 10 includes: wiring board 11 that is rectangular as viewed from the outside, encapsulant 12 of rectangular shape formed on a portion of first surface 11a (the upper surface in FIG. 4) of wiring board 11, and a plurality of electrodes (external electrode terminals) 13 formed on second surface 11b (the lower surface in FIG. 4) that is the surface opposite first surface 11a of wiring board 11. As shown in FIGS. 1 and 2, external electrode terminals 13 are provided in four rows along each side of rectangular wiring board 11.

Wiring board 11 is composed of, for example, a glass-epoxy plastic wiring board having a thickness of 0.25 mm, and as shown in FIGS. 4 and 5, includes wiring 15 and 16 of prescribed patterns on first surface 11a and second surface 11b. As shown in FIG. 5, these wirings 15 and 16 are connected by wiring 17 that passes between the upper and lower surfaces of wiring board 11. Although not shown in the figures, an insulating film (solder resist film) is selectively provided on first surface 11a and second surface 11b of wiring board 11. Accordingly, wirings 15 and 16 are partially exposed on first surface 11a and second surface 11b of wiring board 11. Wiring 15 that is exposed on first surface 11a consists of connection pads 18. Wiring 16 that is exposed on second surface 11b consists of terminal formation pads 19 for forming electrodes (external electrode terminals) 13.

First semiconductor chip 20 is mounted on first surface 11a of wiring board 11. First semiconductor chip 20 has a first surface and second surface that is the surface opposite this first surface. First semiconductor chip 20 has electrodes (bump electrodes) 21 on its first surface, and these electrodes 21 are flip-chip connected to a portion of connection pads 18 (see FIG. 5). Each unit of circuit elements (not shown) formed on first semiconductor chip 20 is electrically connected to connection pad 18 by flip-chip connection. First semiconductor chip 20 is also secured to wiring board 11 by the flip-chip connection. As shown in FIG. 5, a gap exists between wiring board 11 and first semiconductor chip 20, but this gap is filled by underfill plastic 22 composed of insulating plastic. When the gap has been completely filled by underfill plastic 22, underfill plastic 22 protects the first surface of first semiconductor chip 20.

In addition, second semiconductor chip 26 is secured to the second surface (the upper surface in FIG. 4) of first semiconductor chip 20 by insulating adhesive 25.

Second semiconductor chip 26 has a first surface and a second surface that is the surface opposite this first surface. The second surface of second semiconductor chip 26 is connected to first semiconductor chip 20. A plurality of electrodes 27 (see FIG. 5) is provided on the first surface (the upper surface in FIG. 4) of second semiconductor chip 26. These electrodes 27 are provided along each side in proximity to each side of rectangular second semiconductor chip 26. These electrodes 27 are electrically connected to a portion of connection pads 18 by conductive wires 28.

Encapsulant 12 is selectively provided on first surface 11a of wiring board 11 and covers first semiconductor chip 20, second semiconductor chip 26, and wires 28. The present embodiment is of a construction in which the outside edge of wiring board 11 protrudes outside the periphery of encapsulant 12.

Encapsulant 12 is formed by transfer molding. Encapsulant 12 has a rectangular pedestal structure made up from rectangular upper surface 29 of a shape similar to wiring board 11 and sloping side surfaces 30 extending from each side of this upper surface 29 and reaching first surface 11a of wiring board 11.

In addition, a portion of wiring 15 is exposed on first surface 11a that protrudes from the outer periphery of encapsulant 12 (see FIG. 5). In other words, wiring 15 is exposed on the portion of wiring board 11 that projects from encapsulant 12. Linking interconnects 31 composed of, for example, copper are then formed overlying this exposed portion of wiring. These linking interconnects 31 pass from first surface 11a of wiring board 11 and over side surfaces 30 of encapsulant 12 and extend as far as upper surface 29 of encapsulant 12.

As shown in FIG. 3, the end portions of linking interconnects 31 that extend to upper surface 29 of encapsulant 12 form circular terminals referred to as linking connection pads 32. The external electrode terminals on the lower surface of upper semiconductor device 40 are overlaid on and connected to these linking connection pads 32 (see FIG. 2). These linking connection pads 32 need not be circular and may be another shape, for example, square.

Figure 6:
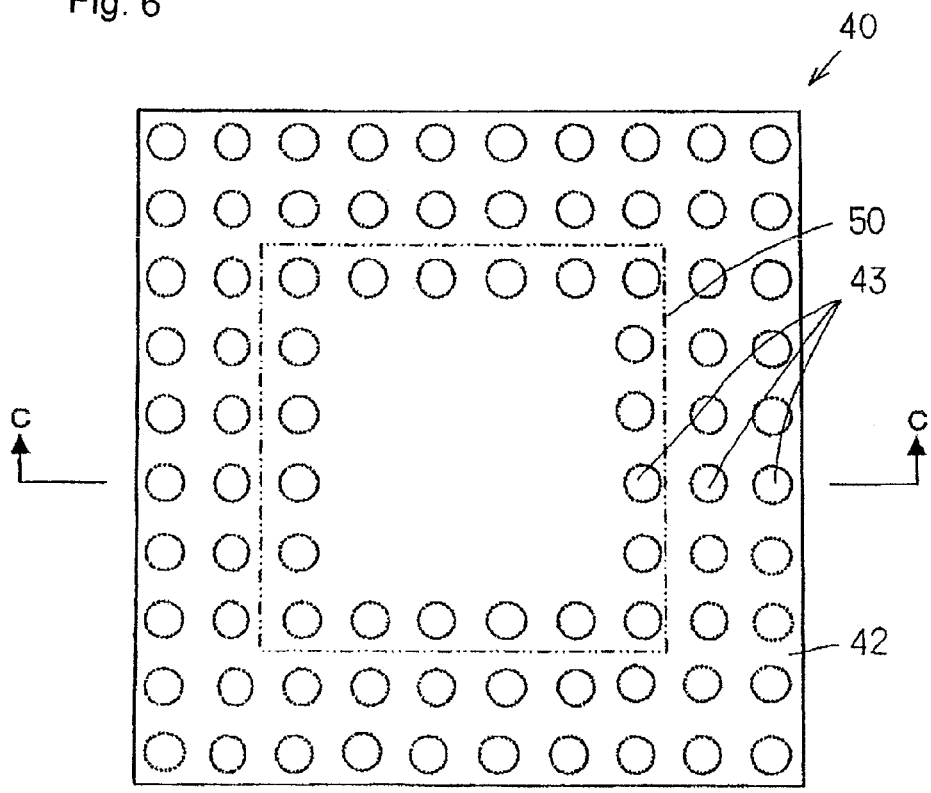
FIG. 6 is a plan view of the second semiconductor device that forms a part of the stacked semiconductor device of the first embodiment.
Figure 7:
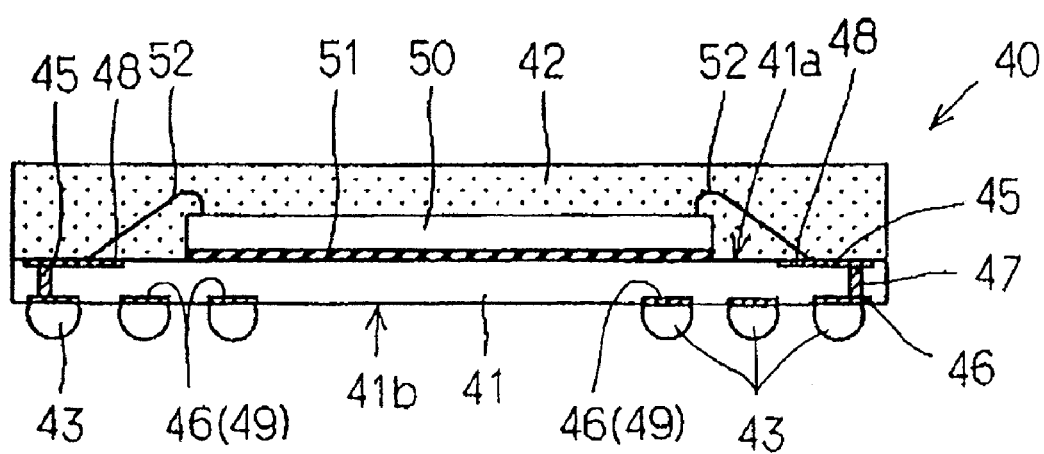
FIG. 7 is an enlarged sectional view taken along line C-C of FIG. 6.
Figure 8:
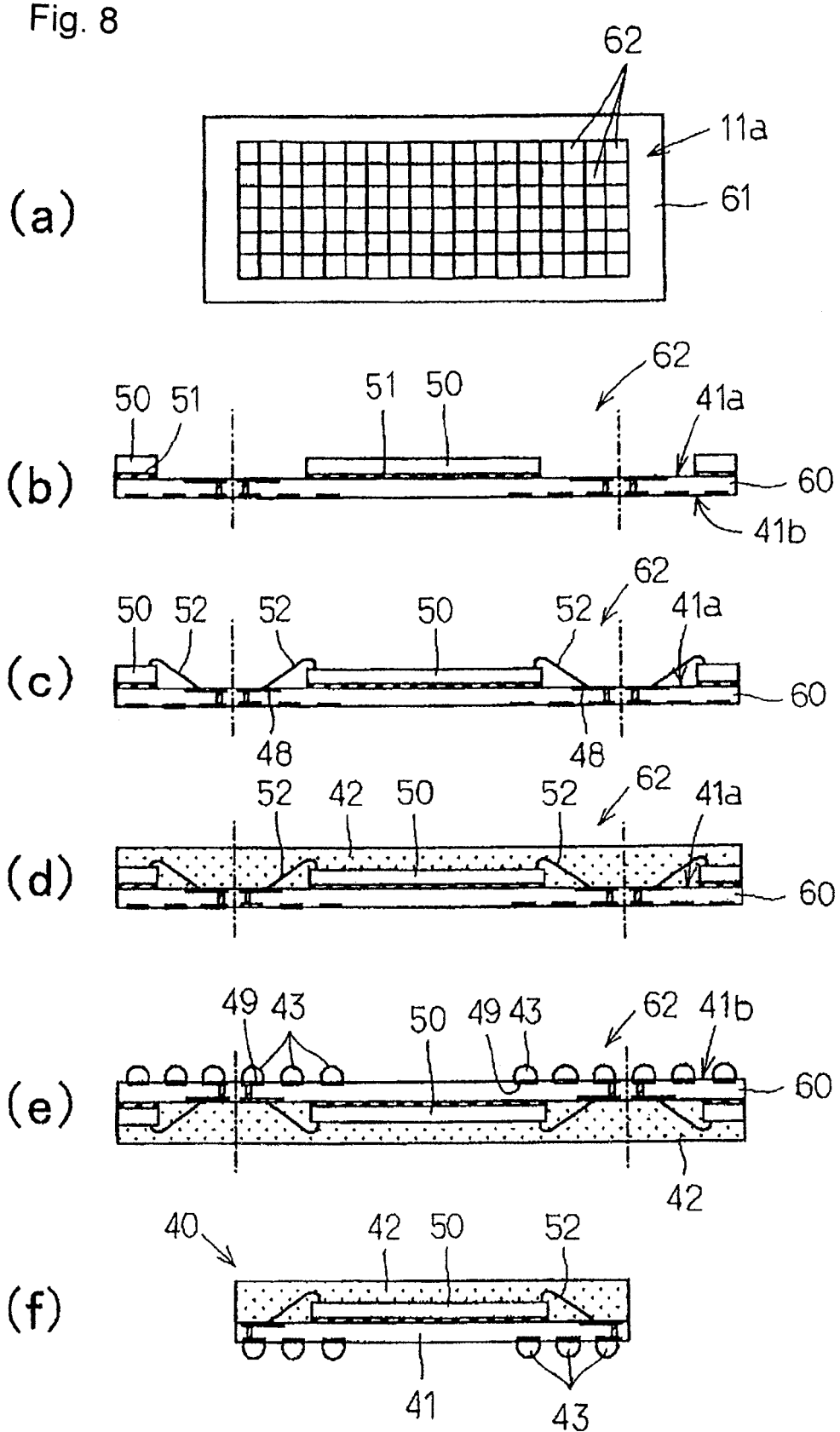
FIGS. 8A, 8B, 8C, 8D, 8E, and 8F are sectional views of steps showing the method for fabricating the second semiconductor device in the fabrication method of a stacked semiconductor device of the first embodiment.
Figure 9:
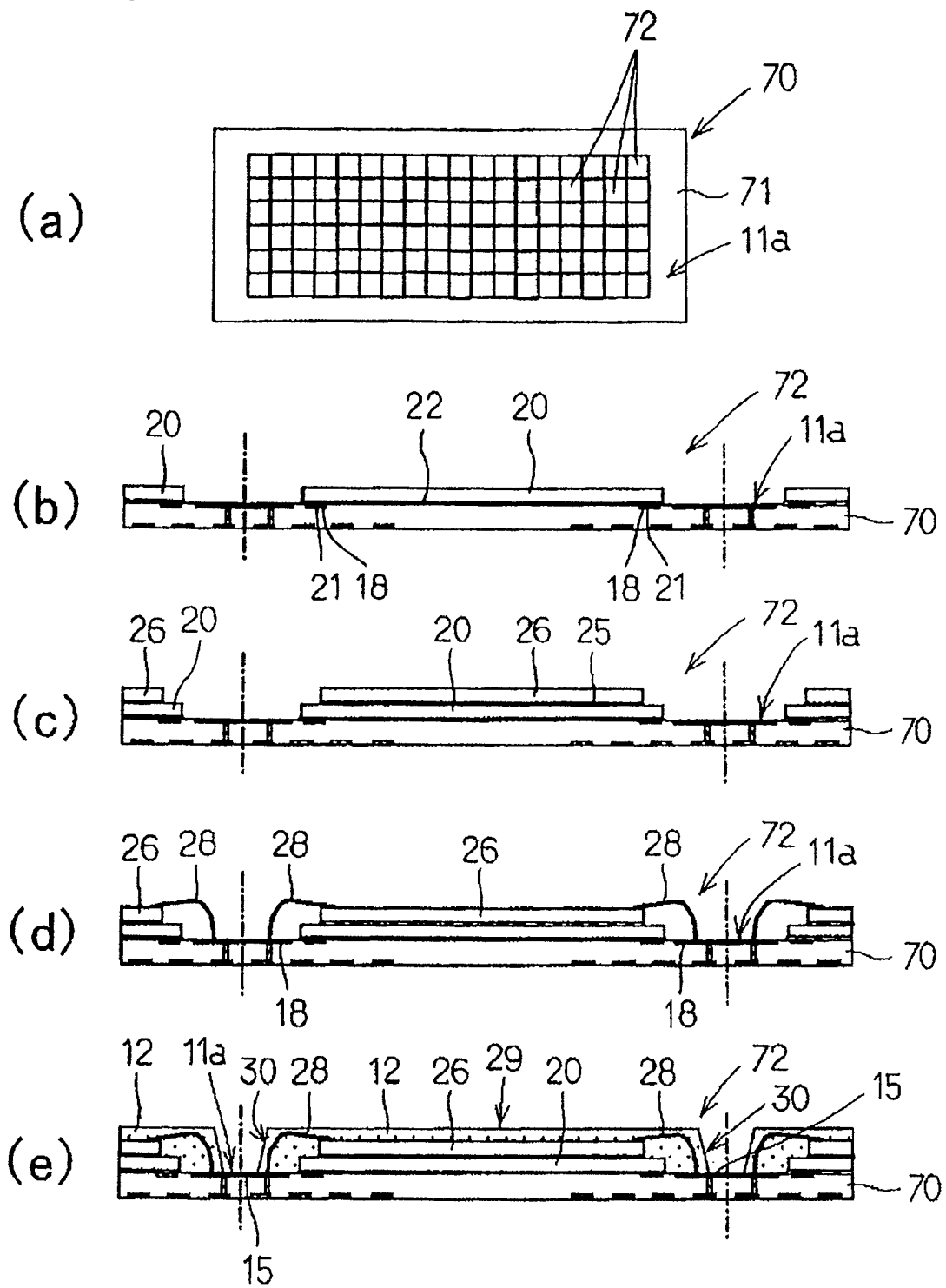
FIGS. 9A, 9B, 9C, 9D, and 9E are sectional views of a portion of the steps showing the method of fabricating a stacked semiconductor device of the first embodiment.
Figure 10:
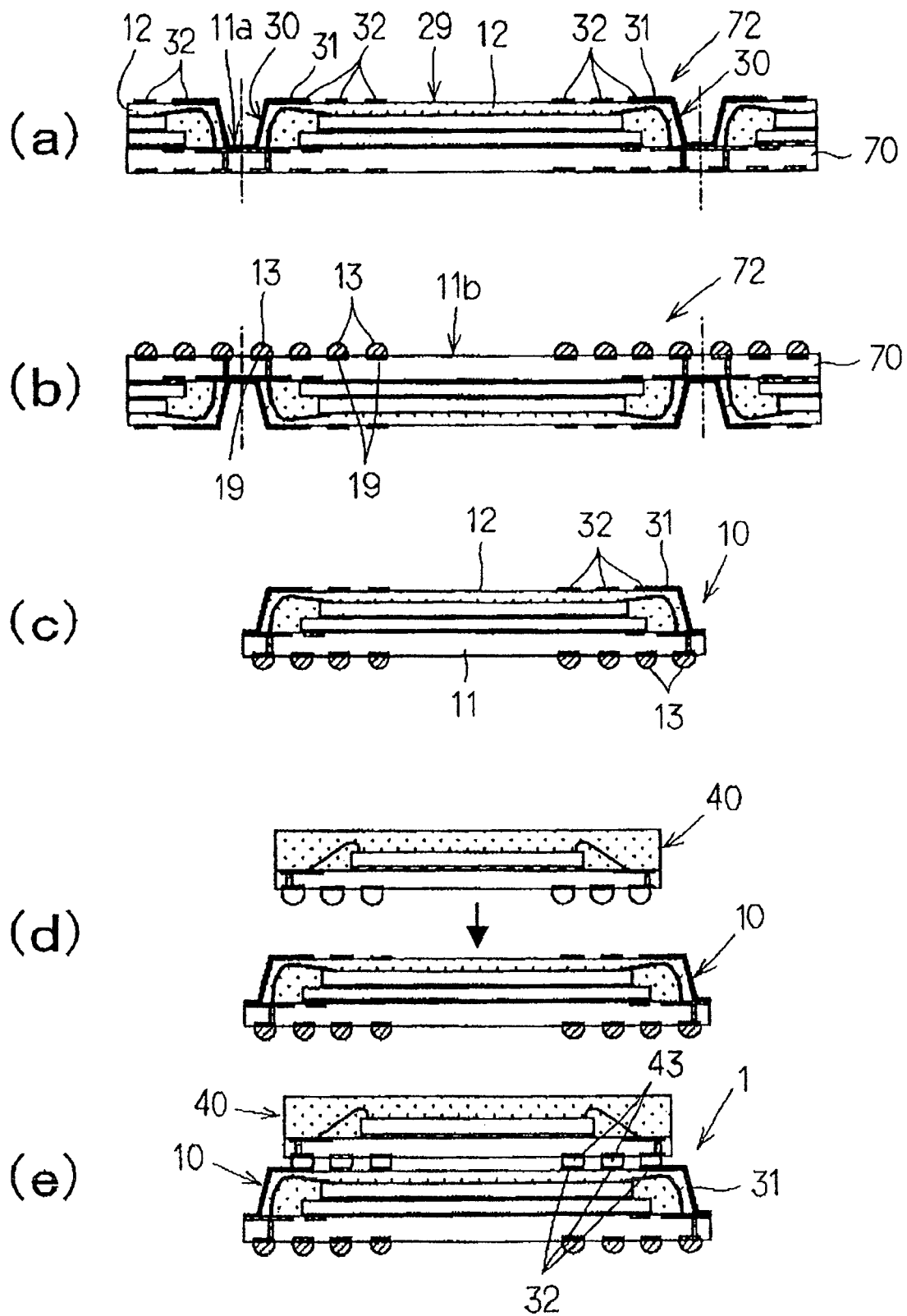

As shown in FIG. 6 and FIG. 7, upper semiconductor device (second semiconductor device) 40 is made up of: wiring board 41 having a rectangular shape as viewed from the outside; encapsulant 42 of rectangular shape that is formed to overlie and match first surface 41a (the upper surface in FIG. 7) of wiring board 41; and a plurality of electrodes (external electrode terminals) 43 formed on second surface 41b (the lower surface in FIG. 7) that is the surface opposite first surface 41a of wiring board 41. As shown in FIG. 6, external electrode terminals 43 are provided in three rows along each side of rectangular wiring board 41.

Wiring board 41 is composed of, for example, glass-epoxy plastic wiring board having a thickness of 0.25 mm, and as shown in FIG. 7, has wirings 45 and 46 of prescribed patterns on first surface 41a and second surface 41b. These wirings 45 and 46 are connected by wiring 47 that passes between the upper and lower surfaces of wiring board 41. Although not shown, an insulating film (solder resist film) is selectively provided on first surface 41a and second surface 41b of wiring board 41, whereby wirings 45 and 46 are partially exposed on first surface 41a and second surface 41b of wiring board 41. Wiring 45 exposed on first surface 41a serves as connection pads 48, and wiring 46 exposed on second surface 41b serves as terminal formation pads 49 for forming electrodes (external electrode terminals) 43.

Semiconductor chip 50 is secured to first surface 41a of wiring board 41 by insulating adhesive 51. Semiconductor chip 50 has electrodes (not shown) on its first surface (the upper surface in FIG. 7). These electrodes and connection pads 48 of wiring board 41 are electrically connected by conductive wires 52.

As shown in FIG. 2, this upper semiconductor device 40 is stacked on lower semiconductor device 10 to form stacked semiconductor device 1. In other words, stacked semiconductor device 1 is fabricated by overlaying and connecting external electrode terminals 43 of upper semiconductor device 40 to linking connection pads 32 of linking interconnects 31 positioned on upper surface 29 of encapsulant 12 of lower semiconductor device 10. External electrode terminals 43 of upper semiconductor device 40 are formed from, for example, solder balls (Sn—Ag—Cu). Accordingly, upper semiconductor device 40 is positioned and overlaid on lower semiconductor device 10, and external electrode terminals 43 are connected to linking connection pads 32 by causing the solder to reflow and briefly fuse.

Explanation next regards the method of fabricating stacked semiconductor device 1 while referring to FIGS. 8A, 8B, 8C, 8D, 8E, and 8F to FIG. 18. FIGS. 8A, 8B, 8C, 8D, 8E, and 8F show the fabrication method of upper semiconductor device 40, and FIGS. 9A, 9B, 9C, 9D, and 9E show a portion of the fabrication method of lower semiconductor device 10. FIGS. 10A, 10B, 10C, 10D, and 10E show a portion of the fabrication method of lower semiconductor device 10 and the method of stacking upper semiconductor device 40 on lower semiconductor device 10 to fabricate stacked semiconductor device 1.

Explanation first regards the fabrication method of upper semiconductor device (the second semiconductor device) 40 while referring to FIGS. 8A, 8B, 8C, 8D, 8E, and 8F.

As shown in FIG. 8A, wiring mother board 60 composed of a wiring board is first prepared. Wiring mother board 60 is partitioned and includes rectangular frame-shaped frame 61 and a plurality of product formation areas 62 that have been formed in vertical and horizontal lines (matrix form) within this frame 61. Wiring mother board 60 is cut vertically and horizontally along the outer edges of product formation areas 62 in the final stage of fabrication, and each product formation part 62 becomes an upper semiconductor device 40, wiring mother board 60 thereby becoming wiring boards 41 by cutting. The construction of product formation areas 62 is exactly the construction of wiring board 41 that has already been explained in FIGS. 6 and 7, and explanation of the construction of product formation areas 62 is therefore here omitted. In FIG. 8A, product formation areas 62 are shown as small squares. The first surface of wiring mother board 60 is first surface 41a of wiring board 41, and the first surface of product formation areas 62 is similarly first surface 41a of wiring board 41. Accordingly, the first surface and second surface of wiring mother board 60 and product formation areas 62 are explained as first surface 41a and second surface 41b.

Next, as shown in FIG. 8B, semiconductor chip 50 is secured to a prescribed position of first surface 41a of each of product formation areas 62. Semiconductor chip 50 includes electrodes (not shown) on its first surface, and the second surface that is the surface opposite this first surface is therefore secured to first surface 41a of wiring mother board 60 with insulating adhesive 51 interposed. In addition, the space between the neighboring pair of alternating long and short dash lines in FIGS. 8B, 8C, 8D, 8E, and 8F is product formation part 62.

Next, as shown in FIG. 8C, electrodes (not shown) of the first surface of semiconductor chip 50 are electrically connected by wires 52 to connection pads 48 of first surface 41a of wiring mother board 60 in each product formation part 62.

Then, as shown in FIG. 8D, blanket molding is carried out and encapsulant 42 composed of insulating plastic is formed over the entire inner area of frame unit 61 of wiring mother board 60. Encapsulant 42 is formed using, for example, a transfer molding device.

Next, as shown in FIG. 8E, external electrode terminals 43 are formed overlying terminal formation pads 49 of second surface 41b of each product formation part 62 of wiring mother board 60. External electrode terminals 43 are bump electrodes formed by solder balls having a diameter of, for example, 250 μm. In their state as bump electrodes, external electrode terminals 43 have a thickness of 150 μm.

Wiring mother board 60 and encapsulant 42 are next cut along the border lines of each product formation part 62 and segmented to produce a plurality of upper semiconductor devices 40. By means of cutting, wiring mother board 60 becomes wiring boards 41.

In the fabrication of lower semiconductor device (first semiconductor device) 10, wiring mother board 70 composed of a wiring board is first prepared as shown in FIG. 9A. In addition, first semiconductor chips are prepared having a first surface and a second surface that is the surface opposite this first surface and having electrodes for flip-chip connection on the first surface. Still further, second semiconductor chips having a first surface and a second surface that is the surface opposite this first surface and having electrodes for wire connection on the first surface are also prepared.

Wiring mother board 70 is partitioned and thus includes frame 71 in the shape of a rectangular frame and a plurality of product formation areas 72 that are formed in horizontal and vertical lines within this frame 71. Wiring mother board 70 is cut vertically and horizontally along the outer edges of product formation areas 72 in the final stage of fabrication, each product formation part 72 becoming a lower semiconductor device 10. Accordingly, by being cut, wiring mother board 70 becomes wiring board 11. The structure of product formation areas 72 is exactly the construction of wiring board 11 that has already been described in FIGS. 3 to 5, and explanation of the construction of product formation areas 72 is therefore here omitted. In FIG. 9A, product formation areas 72 are shown as small squares. In addition, the first surface of wiring mother board 70 is first surface 11a of wiring board 11, and similarly, the first surface of product formation areas 72 is first surface 11a of wiring board 11. Accordingly, the first surface and the second surface of wiring mother board 70 and product formation areas 72 are explained as first surface 11a and second surface 11b.

Next, as shown in FIG. 9B, first semiconductor chip 20 is mounted on a prescribed position of first surface 11a of each product formation part 72. First semiconductor chip 20 is of a flip-chip connection structure, and electrodes 21 of first semiconductor chip 20 are therefore flip-chip connected to connection pads 18 of first surface 11a of each product formation part 72 of wiring mother board 70 (see FIG. 5). After flip-chip bonding, the gap between wiring mother board 70 and first semiconductor chip 20 is filled with insulating plastic, and this gap is further plugged by plastic that has undergone plastic curing (underfill plastic 22) (see FIG. 5). The space between adjacent pairs of alternating long-dash and short-dash lines in FIGS. 9B, 9C, 9D, 9E, and 10A and B is product formation part 72.

Next, as shown in FIG. 9C, second semiconductor chip 26 is connected by insulating adhesive 25 to the second surface of first semiconductor chip 20 by way of the second surface.

Then, as shown in FIG. 9D, the electrodes (electrodes 27 shown in FIG. 5) of second semiconductor chip 26 and connection pads 18 (see FIG. 5) provided on wiring mother board 70 that is positioned away from first semiconductor chip 20 are connected by conductive wires 28. Special care is taken to keep the loop height of wires 28 no more than 100 μm from the upper surface of second semiconductor chip 26 to keep the height of lower semiconductor device 10 as low as possible. In the present embodiment, second semiconductor chip 26 is smaller than first semiconductor chip 20 so that all of second semiconductor chip 26 is positioned within the outer edges of first semiconductor chip 20. However, if there is no obstacle when connecting wires to theb electrodes of second semiconductor chip 26, second semiconductor chip 26 may be of a size such that the outer edges of second semiconductor chip 26 protrude beyond the outer edges of first semiconductor chip 20.

Next, as shown in FIG. 9E, encapsulant 12 is independently formed on first surface 11a of each of product formation areas 72 of wiring mother board 70. Encapsulant 12 is formed of insulating plastic and covers first semiconductor chip 20, second semiconductor chip 26, and wires 28. Encapsulant 12 is formed using, for example, a transfer molding device. In the cavity (depression) of the mold die for forming encapsulant 12 in the transfer molding device, plastic is injected from the bottom of each individual cavity to form encapsulant 12. The exposed portion of encapsulant 12 is made up of upper surface 29 and side surfaces 30 linked to this upper surface 29 and extending at a slope to first surface 11a of product formation part 72. In addition, a portion of wiring 15 of first surface 11a of product formation part 72 projects from encapsulant 12 and is exposed.

Next, as shown in FIG. 10A, linking interconnects 31 that extend from first surface 11a of product formation part 72 to side surfaces 30 and upper surface 29 of encapsulant 12 are formed in each product formation part 72. As shown in FIG. 5, these linking interconnects 31 overlie and electrically connect to exposed wiring 15 that projects from encapsulant 12. The end portions of linking interconnects 31 that extend to upper surface 29 of encapsulant 12 are linking connection pads 32 (see FIG. 3). On linking connection pads 32 are terminals that are to underlie and connect to external electrode terminals 43 of the lower surface of upper semiconductor device 40.

As shown in FIG. 10B, external electrode terminals 13 are formed overlying terminal formation pads 19 of second surface 11b of each product formation part 72 of wiring mother board 70. External electrode terminals 13 are bump electrodes formed from solder balls having a diameter of, for example, 250 μm. In their state as bump electrodes, external electrode terminals 13 have a thickness of 200 μm.

Wiring mother board 70 is next segmented by cutting along the border lines of each product formation part 72, and a plurality of lower semiconductor devices 10 are thus fabricated as shown in FIG. 10C. By being cut, wiring mother board 70 becomes wiring board 11.

As shown in FIG. 10D, upper semiconductor device 40 is next positioned on lower semiconductor device 10. Upper semiconductor device 40 is then overlaid on lower semiconductor device 10 and external electrode terminals 43 of upper semiconductor device 40 then subjected to a heat treatment (reflow) to connect to linking connection pads 32 on upper surface 29 of encapsulant 12 of lower semiconductor device 10. Stacked semiconductor device 1 shown in FIG. 10E is thus fabricated.

Figure 11:
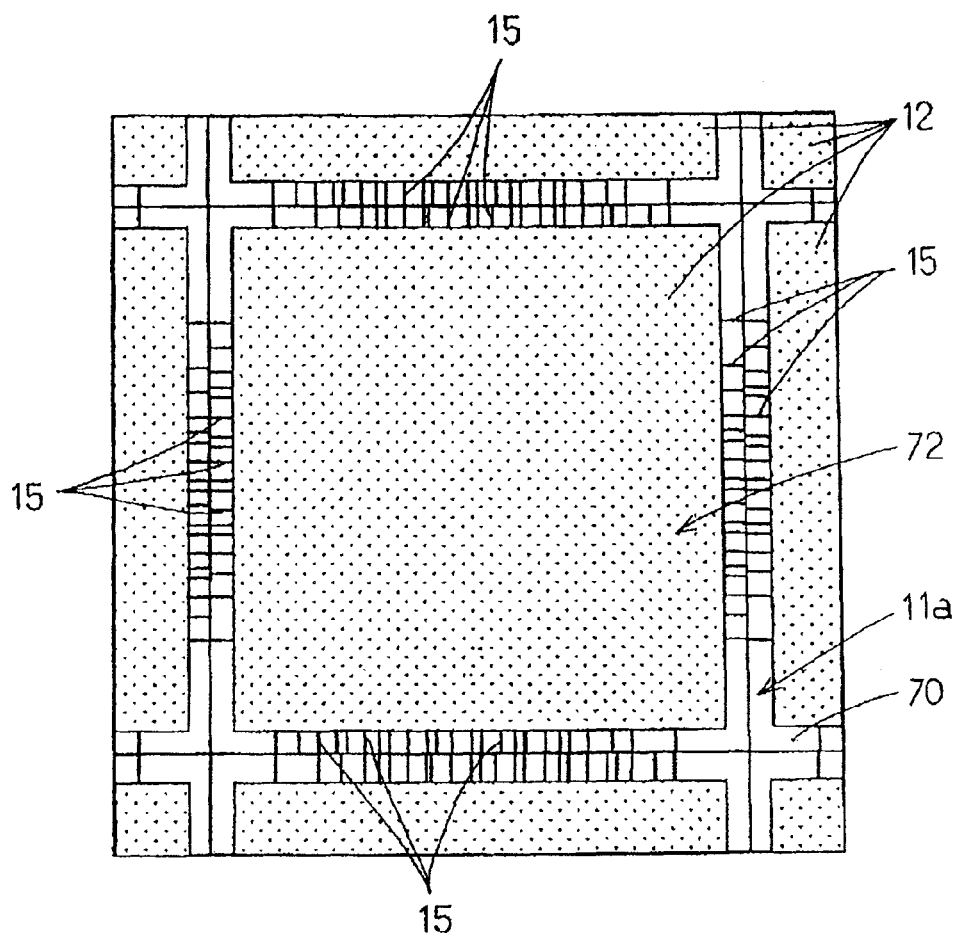
FIG. 11 is a plan view of a product formation part showing the state in which the encapsulant has been formed on the wiring mother board in the fabrication of the above-described first semiconductor device.

Explanation next regards the fabrication method of linking interconnects 31 while referring to FIGS. 11 to 18. FIG. 11 is a plan view of product formation part 72 showing the state in which encapsulant 12 is formed on wiring mother board 70 in the fabrication of lower semiconductor device 10. The lines drawn protruding from the periphery of rectangular encapsulant 12 are wiring 15.

Figure 12:
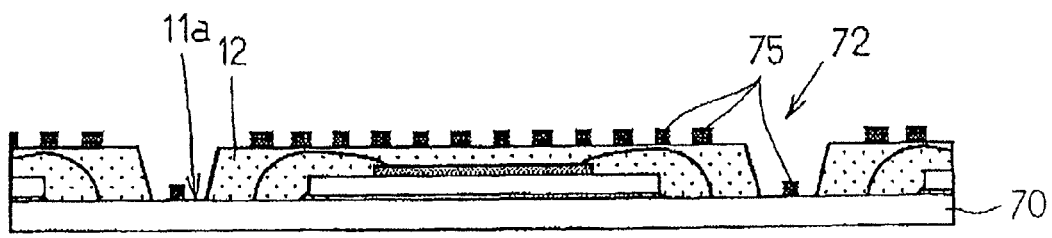
FIG. 12 is a sectional view showing the product formation part of the wiring mother board when a mask has been formed on the encapsulant in the fabrication of the above-described first semiconductor device.
Figure 13:
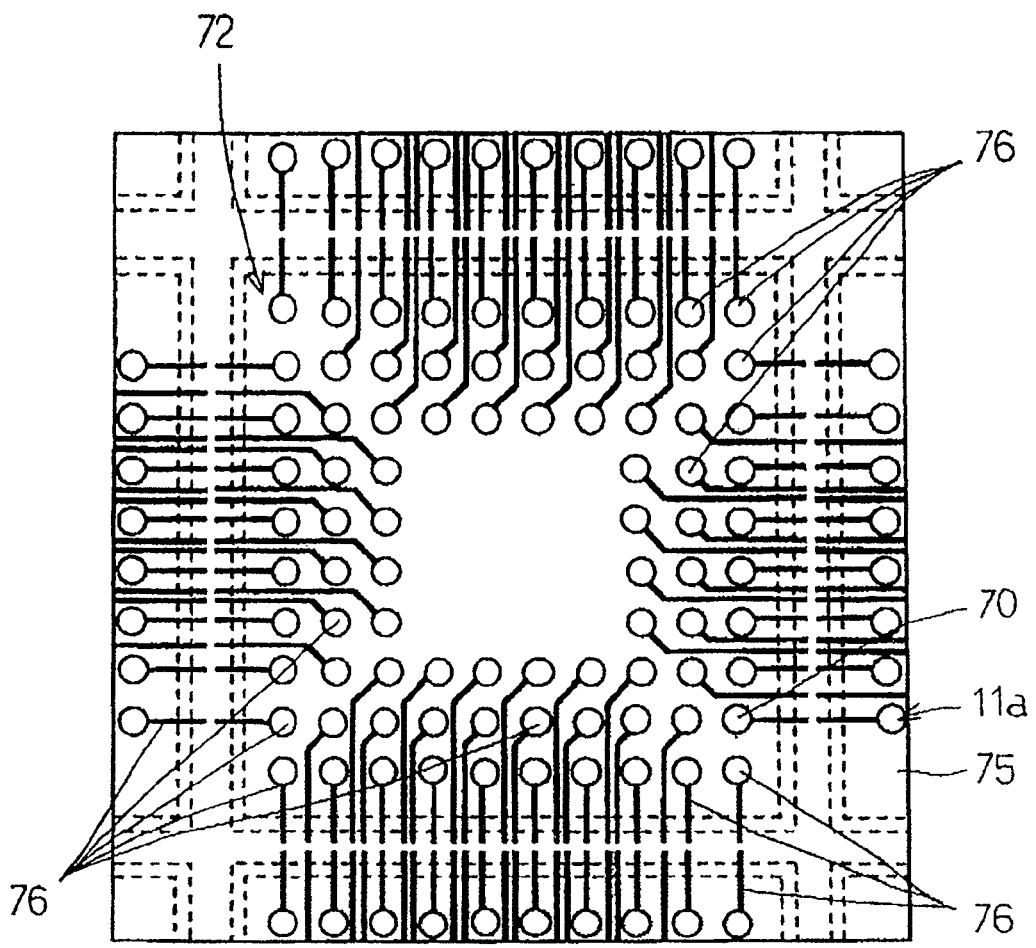
FIG. 13 is a plan view showing the product formation part of the wiring mother board when a mask has been formed on the encapsulant in the fabrication of the above-described first semiconductor device.
Figure 14:
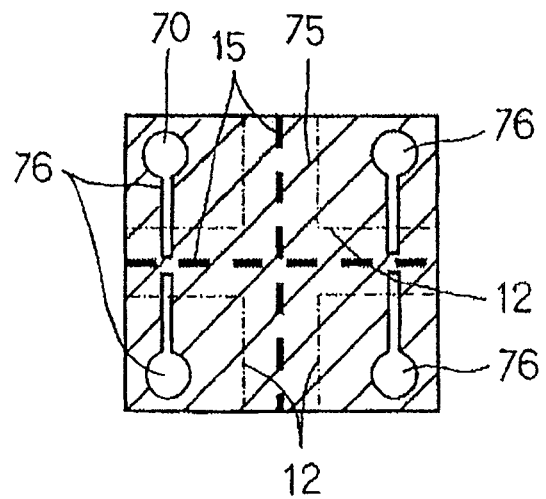
FIG. 14 is an enlarged plan view showing a portion of FIG. 13.

Mask 75 is next formed on first surface 11a of wiring mother board 70. FIG. 12 is a sectional view showing product formation part 72 of wiring mother board 70 with mask 75 formed on encapsulant 12, and FIG. 13 is a plan view. In FIG. 12, mask 75 is depicted in black, and is positioned on the surface of encapsulant 12 and on first surface 11a of wiring mother board 70. This mask 75 is formed by patterning a single metal plate (such as Al or SUS) and is of a construction that can be closely adhered to the surface of encapsulant 12 and first surface 11a. In FIG. 13, the portions depicted as circles and the heavy lines linked to these circles are through-holes (slits) 76. These slits 76 are patterns that match each linking interconnect 31. FIG. 14 shows an enlarged view of a corner of product formation part 72. The hatched portion is mask 75, and the heavy black dotted lines are wiring 15. In FIG. 14, slits 76 are made up from circular portions and linear portions and are shown by contours. In addition, although omitted in the interest of simplifying the figure, the ends of the linear portions of slits 76 overlie wiring 15.

Figure 15:
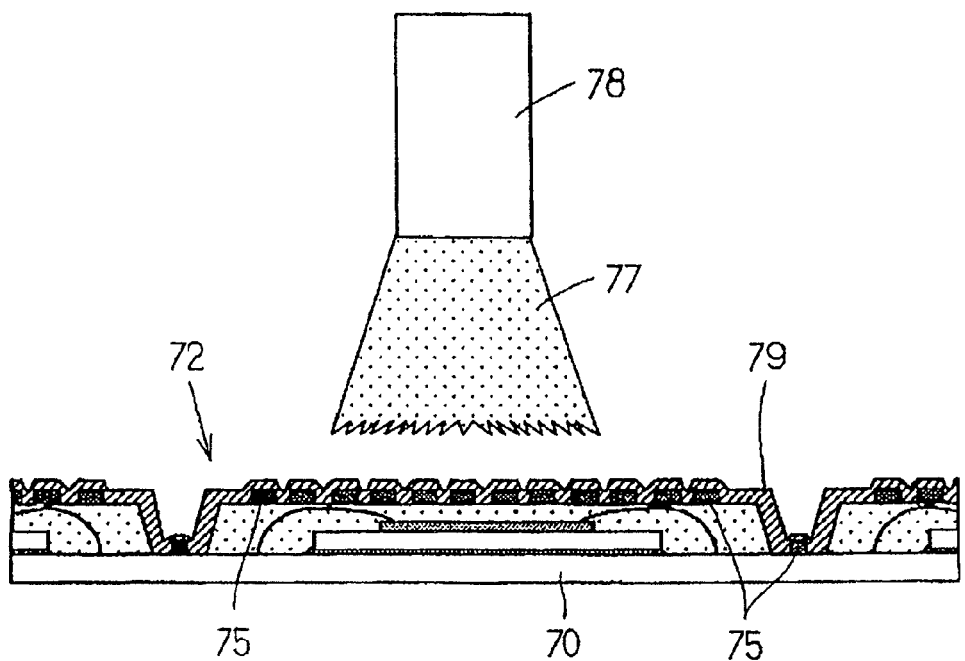
FIG. 15 is a sectional view showing the product formation part of the wiring mother board when a conductive layer is formed on the encapsulant in the fabrication of the above-described first semiconductor device.
Figure 16:
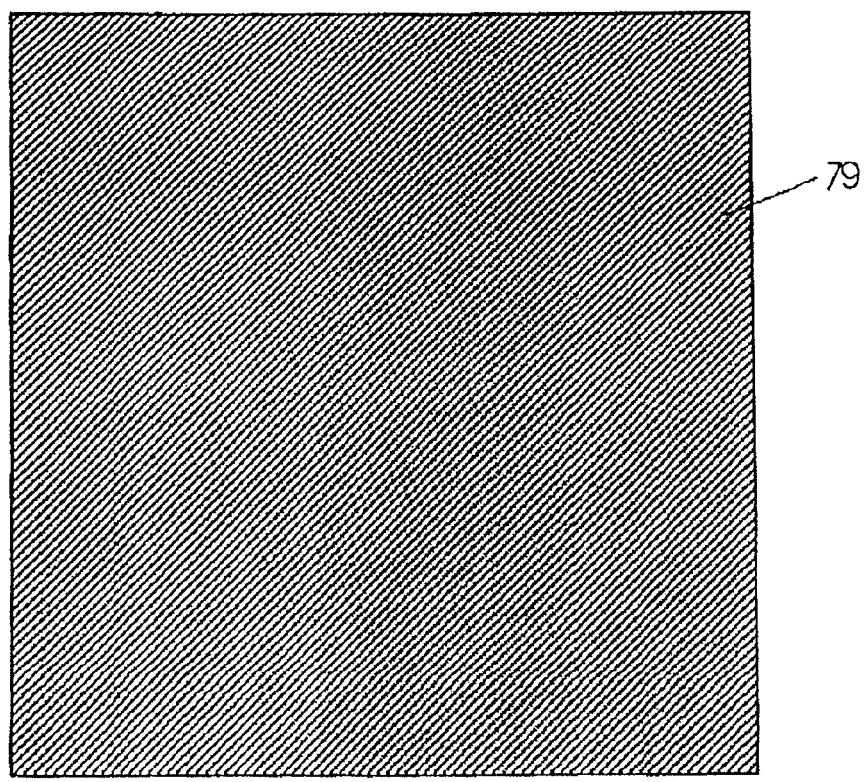
FIG. 16 is a plan view showing the product formation part of the wiring mother board when a conductive layer has been formed on the encapsulant in the fabrication of the above-described first semiconductor device.

Next, as shown in FIG. 15, ink 77 containing metal particles (for example, copper particles) is uniformly applied (sprayed) by ink jet nozzle 78 over the entire surface of first surface 11a of product formation part 72 of wiring mother board 70 to form ink layer 79 of uniform thickness. FIG. 16 is a plan view showing ink layer 79 that has been applied to the portion of wiring mother board 70 shown in FIG. 15.

Mask 75 is next removed from wiring mother board 70 such that the shape of ink layer 79 that fills slits 76 is not damaged.

Figure 17:
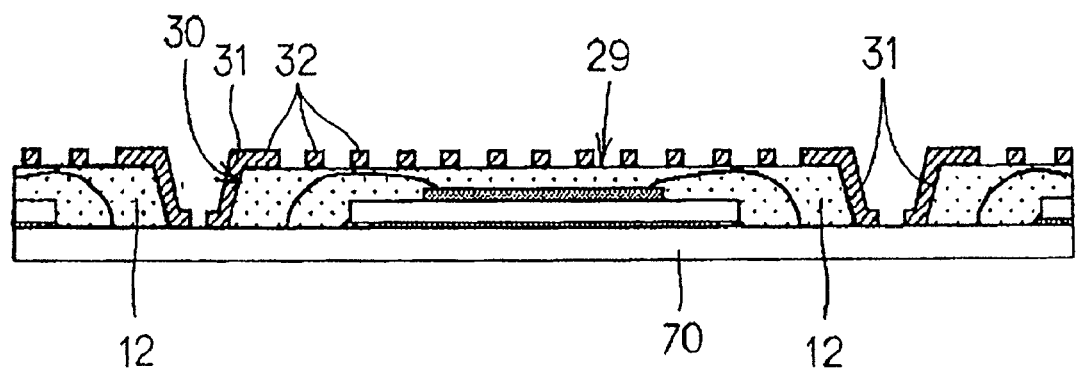
FIG. 17 is a sectional view showing the product formation part of the wiring mother board when linking interconnects composed of a conductive layer have been formed on the encapsulant in the fabrication of the above-described first semiconductor device.
Figure 18:
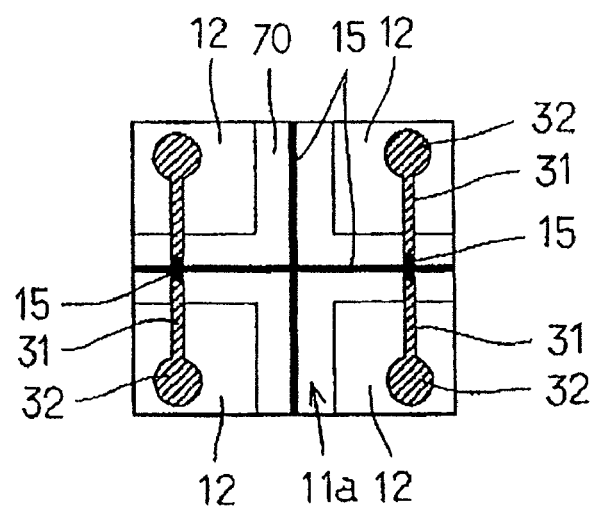
FIG. 18 is an enlarged plan view showing a portion of the product formation part of the wiring mother board when linking interconnects composed of a conductive layer have been formed on the encapsulant in the fabrication of the above-described first semiconductor device.

Ink layer 79 that remains on the surfaces of wiring mother board 70 and encapsulant 12 is next subjected to a curing process. The curing process is, for example, a 30-minute process at a temperature of 160-170° C. This curing process eliminates organic components such as binders contained in the ink to form a conductor layer, whereby linking interconnects 31 are formed as shown in FIG. 17. Linking connection pads 32 that pass from upper surface 29 and over side surfaces 30 of encapsulant 12 and extend as far as first surface 11a of product formation part 72 are constructed to overlie and electrically connect to wiring 15 as shown in FIG. 5 and FIG. 18. In this way, wiring 15 that is exposed outside encapsulant 12 is led out to the upper surface of encapsulant 12 by each linking interconnect 31, whereby linking connection pads 32 of upper surface 29 of encapsulant 12 serve as the lead-out terminals of each of wiring 15. Wiring 15 is omitted in FIGS. 12, 15, and 17.

The first embodiment has the following effects:

(1) In lower semiconductor device 10, a portion of wiring 15 of the upper surface (first surface 11a) of wiring board 11 that is provided with encapsulant projects from encapsulant 12 and is exposed, and linking interconnects 31 that are electrically connected to this exposed wiring 15 are positioned to extend over upper surface 29 of encapsulant 12. Electrodes (external electrode terminals) 43 of the lower surface of upper semiconductor device 40 (second surface 41b of wiring board 41) are of a configuration to electrically connect to the portion of each linking interconnect (linking connection pads 32) on upper surface 29 of encapsulant 12. When a plurality of semiconductor chips (for example, first semiconductor chip 20 and second semiconductor chip 26) are stacked and mounted within encapsulant 12 of lower semiconductor device 10, the thickness (height) of encapsulant 12 inevitably increases (increases in height). However, a configuration is adopted in which electrodes (external electrode terminals) 43 of upper semiconductor device 40 overlie and connect to portions of the linking interconnects (linking connection pads 32) provided on upper surface 29 of encapsulant 12 of lower semiconductor device 10, and the thickness of electrodes 43 can therefore be made thin without being affected by the thickness of encapsulant 12 of lower semiconductor device 10, whereby stacked semiconductor device 1 of a thinner construction can be achieved.

Electrodes (external electrode terminals) 43 of upper semiconductor device 40 are bump electrodes formed by, for example, solder balls, but these solder balls can be constructed with a diameter of 200-300 μm, thereby enabling stacked semiconductor device 1 of a thinner construction.

(2) In lower semiconductor device 10, a construction is adopted in which a portion of wiring 15 of the upper surface (first surface 11a) of wiring board 11 that is provided with encapsulant 12 projects from encapsulant 12 and is thus exposed, whereby the outer edges of wiring board 11 protrude beyond encapsulant 12. The length of protrusion of wiring board 11 that protrudes from the periphery of encapsulant 12 need only be sufficient to allow wiring 15 provided on wiring board 11 to electrically connect with linking interconnects 31, and the length of protrusion of the periphery of the wiring board can therefore be made shorter than in a construction in which bump electrodes are arranged, whereby stacked semiconductor device 1 of a smaller size can be achieved.

(3) Due to points (1) and (2) described above, stacked semiconductor device 1 of smaller size and thinner construction can be achieved.

(4) Stacked semiconductor device 1 of higher density and greater integration can be constructed because a plurality of semiconductor chips can be stacked and mounted on each of lower semiconductor device 10 and upper semiconductor device 40.

(5) In lower semiconductor device 10, a configuration is adopted in which the connection portions (the portions of the linking interconnects, i.e., linking connection pads 32) for connecting with upper semiconductor device 40 are arranged on upper surface 29 of encapsulant 12, whereby the arrangement of the connection portions is not subject to restrictions and the degree of freedom of design of stacked semiconductor device 1 is increased.

Second Embodiment

Figure 19:
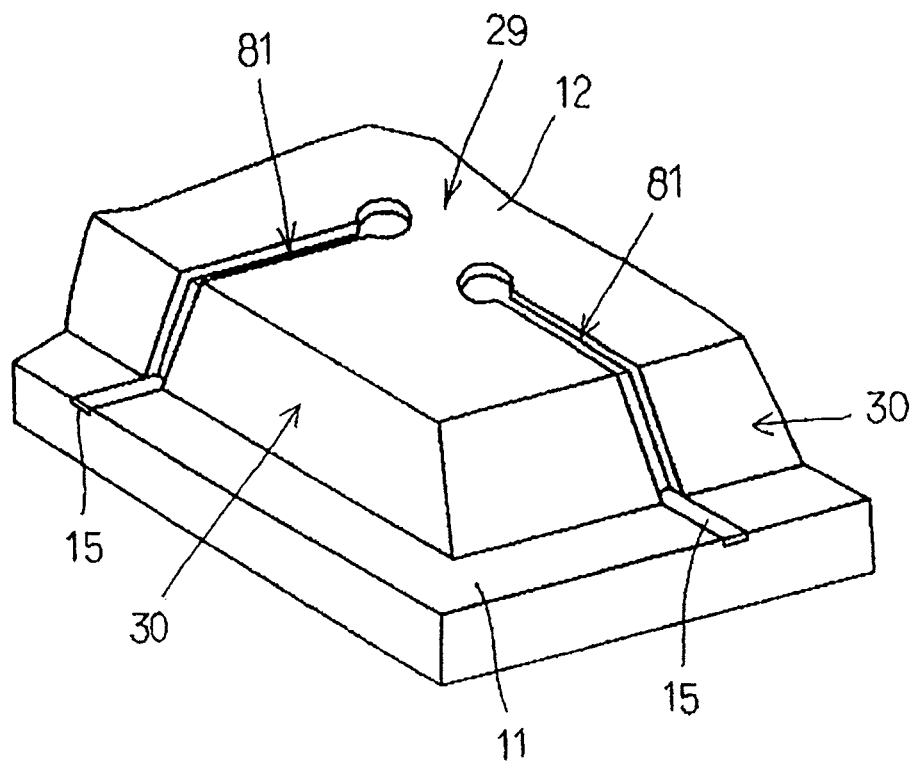
FIG. 19 is a perspective view showing a portion of the product formation part of the wiring mother board showing a state in which wiring formation trenches have been formed on the surface of the encapsulant in the method of fabricating a stacked semiconductor device of the second embodiment of the present invention.
Figure 21:
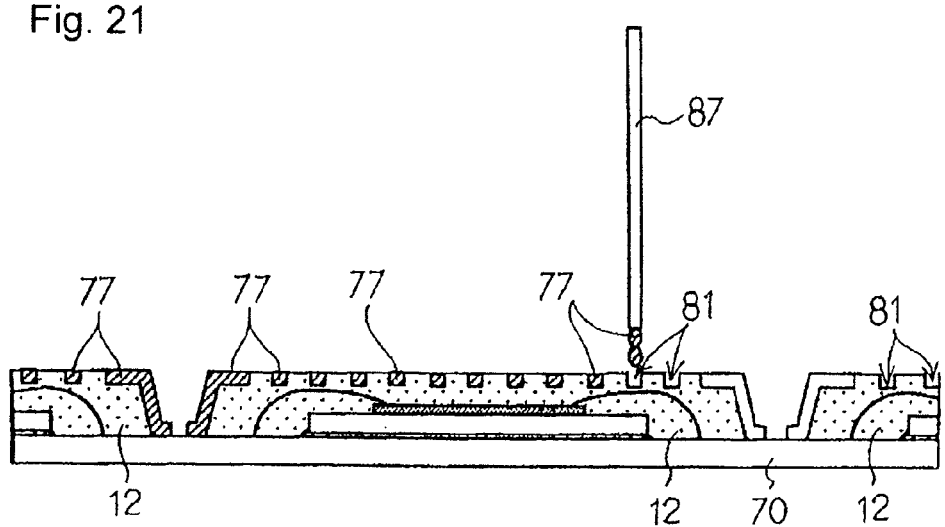
FIG. 21 is a sectional view showing the state of filling the above-described wiring formation trenches with a conductive material.
Figure 22:
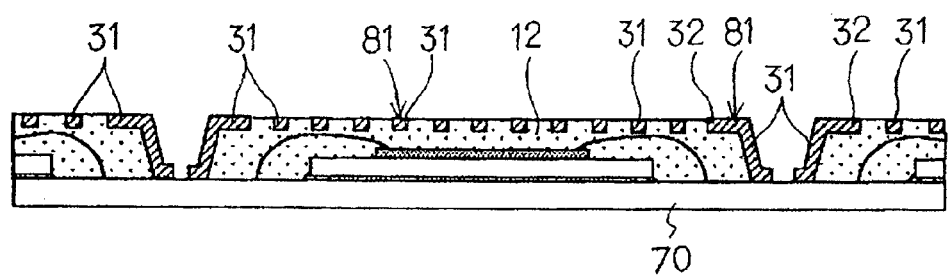
FIG. 22 is a sectional view showing the state in which linking interconnects have been formed in the above-described wiring formation trenches.
Figure 23:
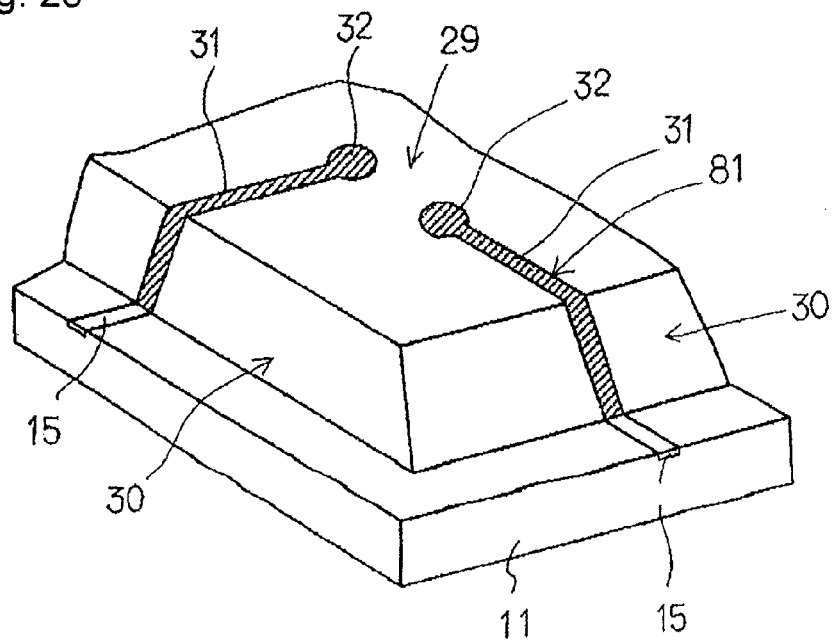
FIG. 23 is a partial perspective view showing the state in which linking interconnects have been formed in the above-described wiring formation trenches.

FIGS. 19 to 23 relate to the fabrication method of a stacked semiconductor device of the second embodiment of the present invention. The second embodiment relates to another method of forming linking interconnects 31 of lower semiconductor device 10 in the fabrication method of a stacked semiconductor device of the first embodiment. In other words, the portions of linking interconnects 31 that overlie encapsulant 12 are formed in trenches 81 provided from side surfaces 30 and across upper surface 29 of encapsulant 12. FIG. 19 shows trenches 81 provided from side surfaces 30 and across upper surface 29 of encapsulant 12, and FIG. 23 shows linking interconnects 31 that are embedded in trenches 81. The circular portions of upper surface 29 of encapsulant 12 serve as linking connection pads 32.

Figure 20:
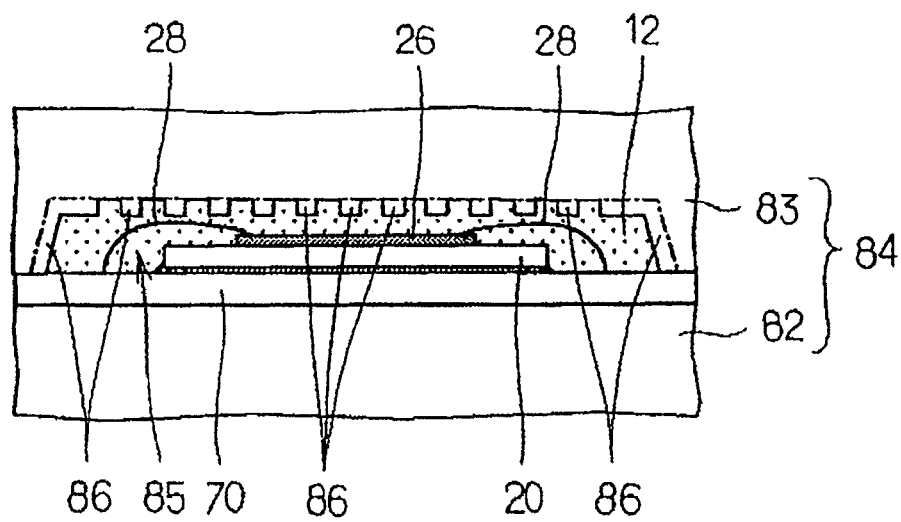
FIG. 20 is a sectional view showing the state of transfer molding for forming the above-described wiring formation trenches.

When fabricating lower semiconductor device 10 of this configuration, a mold die provided with protrusions corresponding to linking interconnects in the wall surface of the cavities that are filled with plastic is used in the step of forming encapsulant 12 by means of transfer molding. As shown in FIG. 20, a mold die 84 made up from lower die 82 and upper die 83 is used in the transfer molding. At this time, protrusions 86 are provided in the portions where linking interconnects 31 are to be formed in upper die 83 having cavity (depression) 85 for forming encapsulant 12. In this way, trenches 81 are selectively formed in side surfaces 30 and upper surface 29 of encapsulant 12, as shown in FIG. 21.

Dispenser nozzle 87 is next operated to fill trenches 81 with ink 77 containing metal particles. Ink 77 is then subjected to a curing process as in the first embodiment to form linking interconnects 31 in trenches 81 as shown in FIGS. 22 and 23.

According to this embodiment, the introduction of ink 77 into trenches 81 to form linking interconnects 31 enables the formation of linking interconnects 31 with high accuracy. In addition, linking interconnects 31 that overlie encapsulant 12 are formed in trenches 81 provided from side surfaces 30 and across upper surface 29 of encapsulant 12, whereby the height of the protrusion (thickness) of linking interconnects 31 that protrude on upper surface 29 of encapsulant 12 can be made thinner than the case of lower semiconductor device 10 of the first embodiment. As a result, stacked semiconductor device 1 of even thinner construction can be achieved.

Third Embodiment

Figure 24:
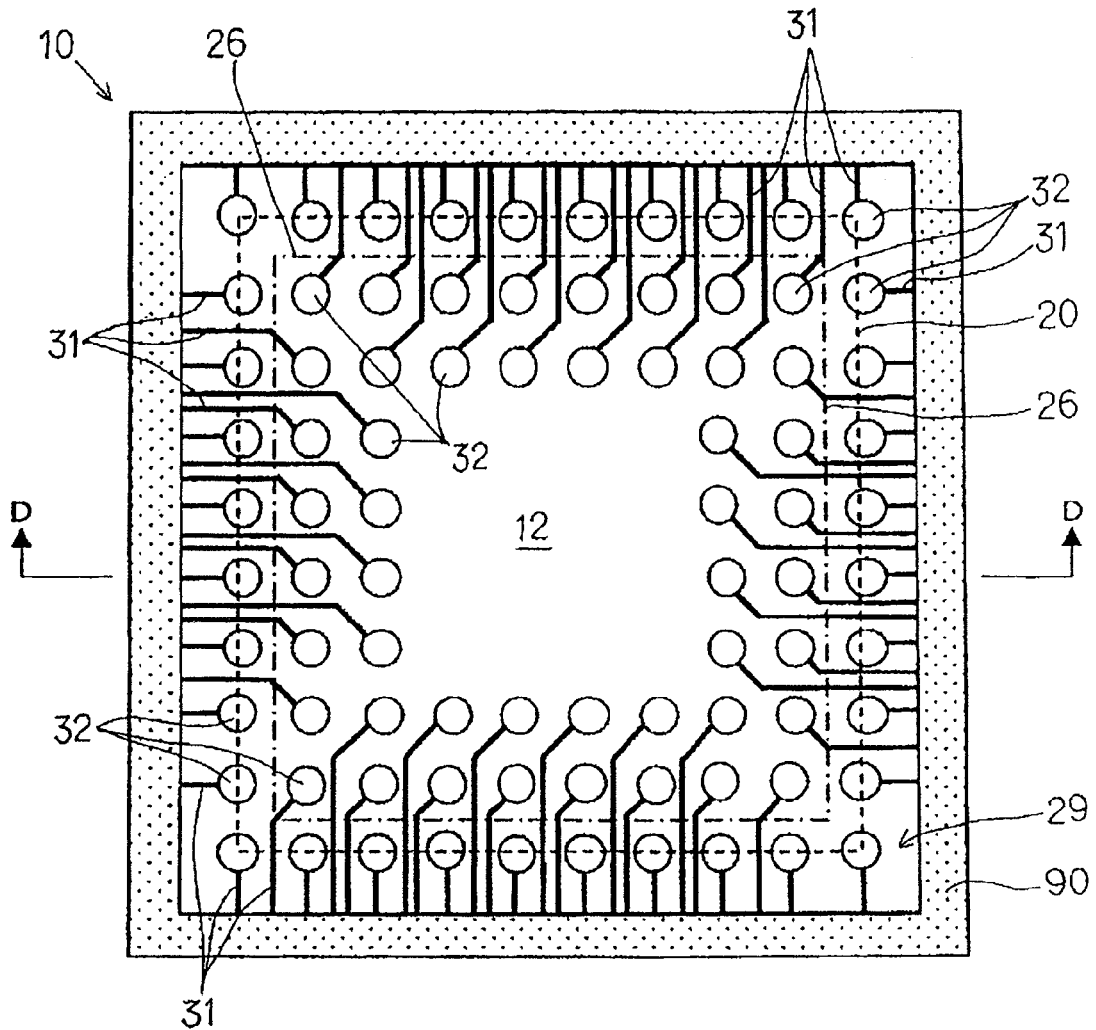
FIG. 24 is a plan view showing the first semiconductor device that has been fabricated by the stacked semiconductor device fabrication method that is the third embodiment of the present invention.
Figure 25:
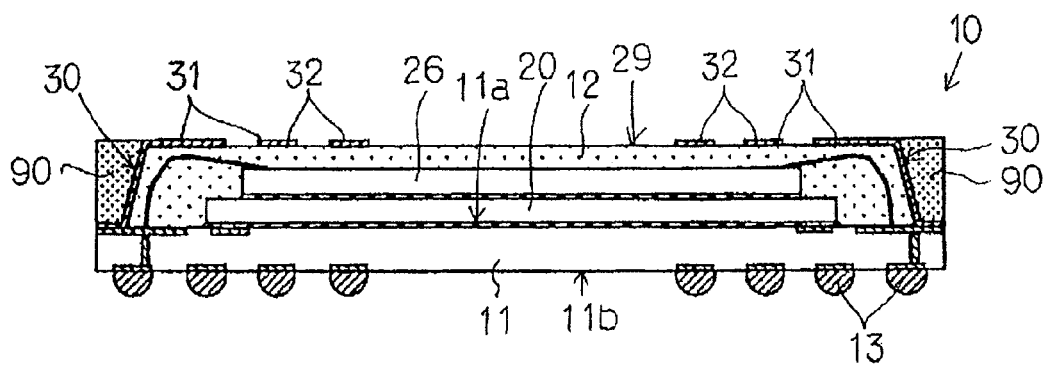
FIG. 25 is a sectional view taken along line D-D of FIG. 24.

FIG. 24 is a plan view showing the first semiconductor device that has been fabricated by the fabrication method of a stacked semiconductor device of the third embodiment of the present invention. FIG. 25 is a sectional view taken along line D-D of FIG. 24.

As shown in FIG. 24 and FIG. 25, in lower semiconductor device 10 in the stacked semiconductor device of the third embodiment, protective layer 90 composed of insulating plastic covers the portions of linking interconnects 31 on the side of first surface 11a of wiring board 11 that extends from side surfaces 30 of encapsulant 12 and reaches the outer edges of wiring board 11 on lower semiconductor device 10 of the first embodiment.

In this lower semiconductor device 10, in the fabrication method of lower semiconductor device 10 of the first embodiment shown in FIGS. 10(a)-(c), protective layer 90 is formed after forming linking interconnects 31 as shown in FIG. 10(b) by embedding insulating plastic at the outer periphery of encapsulant 12 of each product formation part 72 of wiring mother board 70 to approximately the same height as encapsulant 12. External electrode terminals 13 are next formed, following which wiring mother board 70 is cut together with protective layer 90 to produce lower semiconductor device 10 shown in FIG. 24 an FIG. 25.

According to the third embodiment, the portions of linking interconnects 31 positioned on side surfaces 30 of encapsulant 12 in lower semiconductor device 10 are protected by protective layer 90, thus preventing short-circuit defects that occur when extraneous matter adheres to wiring 15 and linking interconnects 31 and raising the reliability of stacked semiconductor device 1.

Fourth Embodiment

Figure 26:
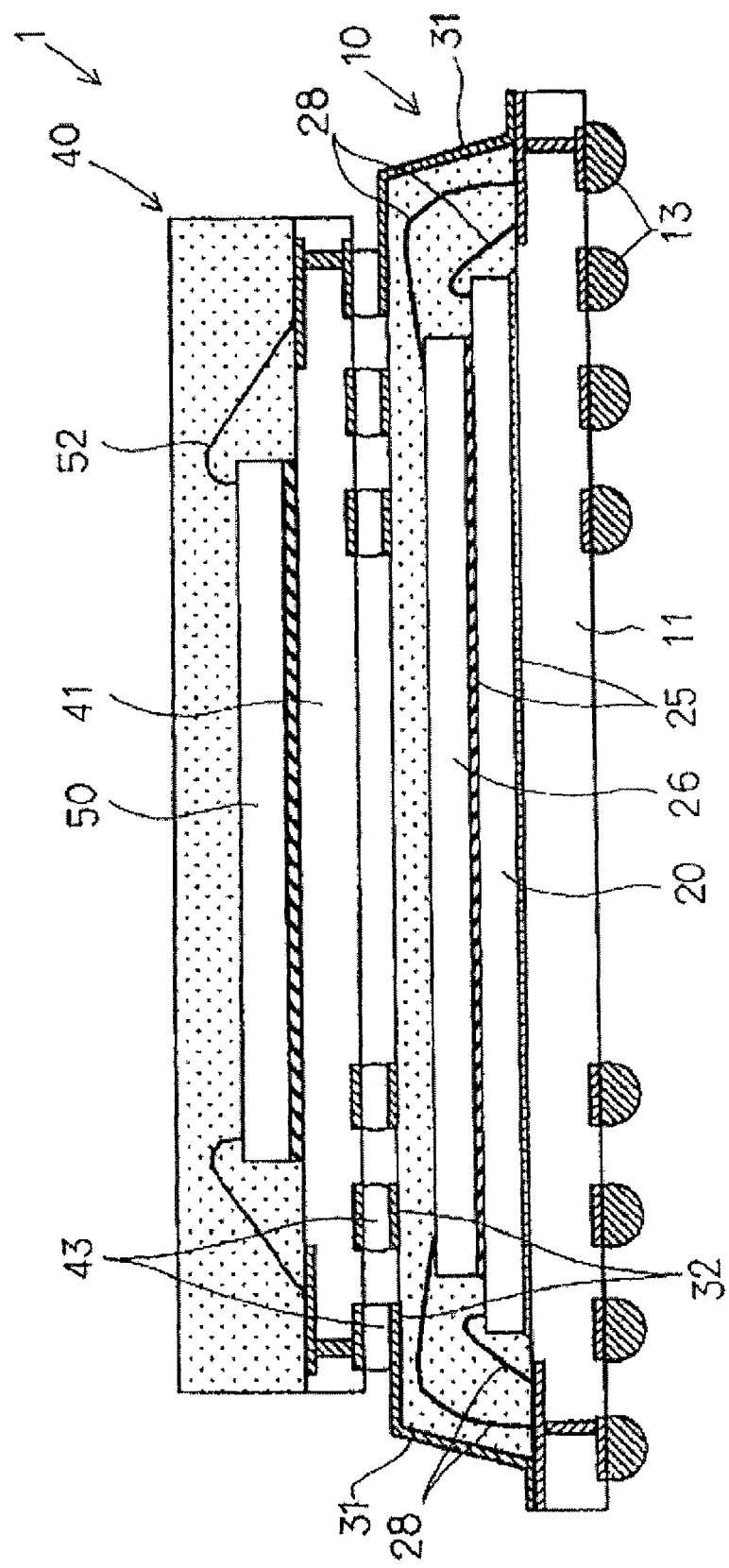
FIG. 26 is a sectional view showing a stacked semiconductor device that has been fabricated by the stacked semiconductor device fabrication method that is the fourth embodiment of the present invention.

FIG. 26 is a sectional view showing a stacked semiconductor device that has been fabricated by the fabrication method of a stacked semiconductor device that is the fourth embodiment of the present invention.

Stacked semiconductor device 1 of the fourth embodiment is of a configuration in which electrodes (not shown) of first semiconductor chip 20 of lower semiconductor device 10 are connected by wires 28 to wiring 15 (connection pads 18) of wiring board 11 in stacked semiconductor device 1 of the first embodiment. Since this is a configuration in which the electrodes are connected to wiring 15 by means of wires 28, the second surface of first semiconductor chip 20 is secured to wiring board 11 by insulating adhesive 25. In addition, this is a configuration in which the second surface of second semiconductor chip 26 is connected by insulating adhesive 25 to the first surface of first semiconductor chip 20.

As a result, either of flip-chip connection and wire connection can be adopted as the connection means for realizing connection between the wiring and the electrodes of two semiconductor chips mounted on wiring board 11 in lower semiconductor device 10. In addition, two or more semiconductor chips can also be stacked and mounted on upper semiconductor device 40. In such a case as well, either of flip-chip connection and wire connection can be adopted.

Fifth Embodiment

Figure 27:
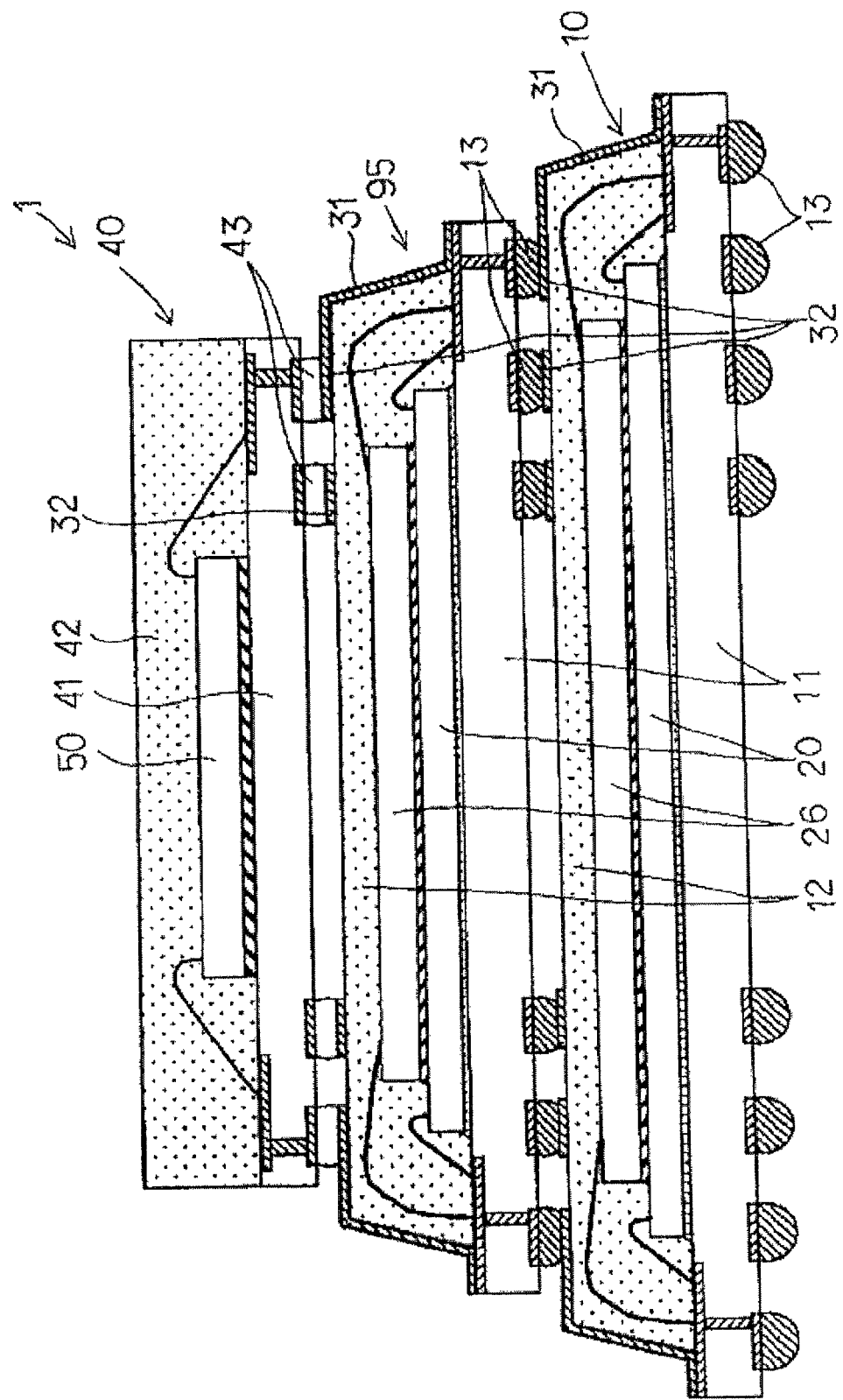
FIG. 27 is a sectional view showing a stacked semiconductor device according to the fifth embodiment of the present invention.

FIG. 27 is a sectional view of the stacked semiconductor device that is the fifth embodiment of the present invention. Stacked semiconductor device 1 of the fifth embodiment is of a configuration in which even more semiconductor devices are stacked, three semiconductor devices being stacked in the case of the embodiment.

In a construction in which three or more semiconductor devices are stacked, one or a plurality of middle semiconductor devices are in a stacked arrangement between the lowermost semiconductor device and the uppermost semiconductor device. The lowermost semiconductor device is lower semiconductor device (first semiconductor device) 10 in the case of the first embodiment. The uppermost semiconductor device is upper semiconductor device (second semiconductor device) 40 in the first embodiment. Middle semiconductor device (third semiconductor device) 95, while having some differing dimensions, is of the same configuration as the lower semiconductor device of the first embodiment. Accordingly, the names and reference numbers of each portion of middle semiconductor device (third semiconductor device) 95 are the same as for lower semiconductor device (first semiconductor device) 10.

External electrode terminals 13 on the lower surface side of middle semiconductor device (third semiconductor device) 95 overlie and connect with linking connection pads 32 of the semiconductor device below third semiconductor device 95. Further, according to this configuration, the external electrode terminals on the lower surface side of the semiconductor device above third semiconductor device 95 overlie and connect with linking connection pads 32 of upper surface 29 of encapsulant 12 of third semiconductor device 95.

Middle semiconductor device (third semiconductor device) 95 has linking connection pads 32 on upper surface 29 of encapsulant 12. Linking connection pads 32 are of a construction formed by linking interconnects 31 provided from side surfaces 30 and across upper surface 29 of encapsulant 12, and upper semiconductor devices of higher levels are therefore smaller than semiconductor devices of lower levels.

The fifth embodiment enables the provision of a stacked semiconductor device having even higher density and greater integration.

Although the invention constructed by the present inventors has been specifically described based on embodiments, the present invention is not limited by the above-described embodiments and is of course open to various modifications within a scope that does not depart from the spirit of the invention.

Figure 28:
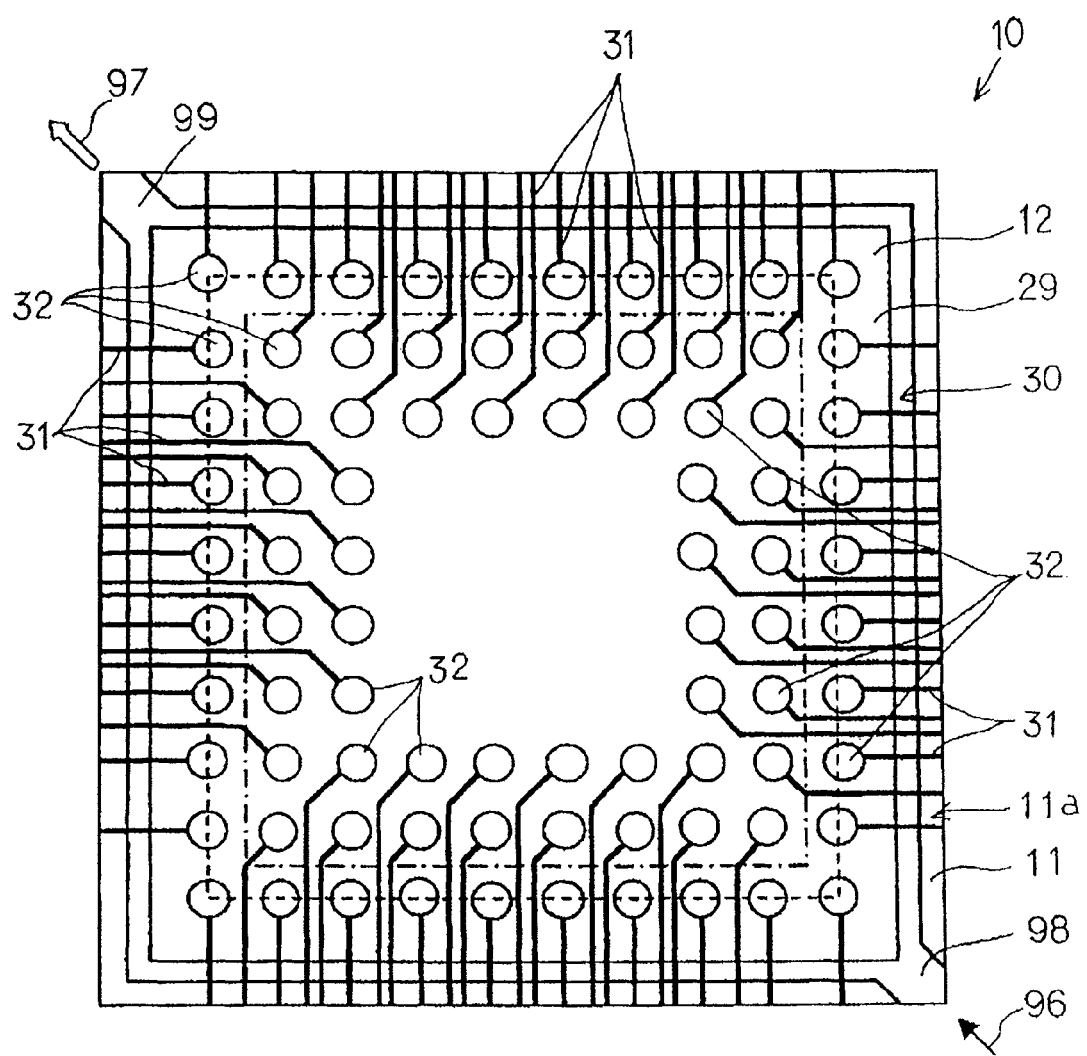
FIG. 28 is a plan view of the lower semiconductor device in the stacked semiconductor device according to another embodiment of the present invention.
Figure 29:
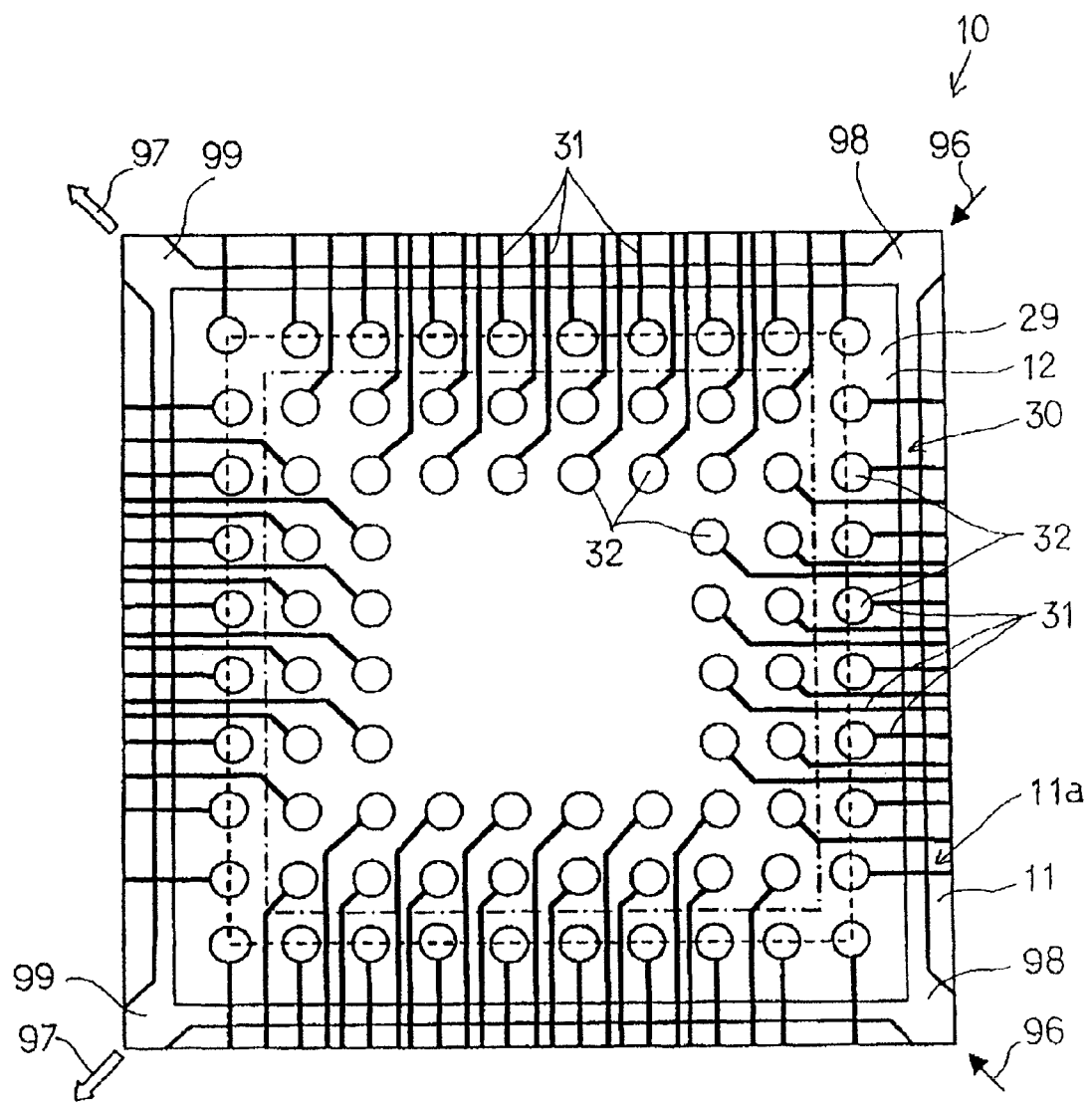
FIG. 29 is a plan view of the lower semiconductor device in a stacked semiconductor device according to another embodiment of the present invention.

For example, although a configuration was adopted in the embodiments in which independently formed encapsulant 12 exposed the outer periphery of each product formation part 72 as a frame shape in the fabrication of lower semiconductor device 10, the encapsulant may also be formed by means of a transfer molding method in which plastic flows successively through cavities (depressions) of adjacent product formation areas. FIGS. 28 and 29 are plan views of lower semiconductor device 10 after fabrication, but at the time of forming encapsulant 12, encapsulant 12 may be formed by introducing plastic from the direction indicated by arrow 96, and then, causing plastic to flow out in the direction indicated by arrow 97 to form the encapsulant of the adjacent product formation part. Plastic portions 98 and 99 that have been cured in the path of flow on the inflow side and outflow side of this plastic have a uniform thickness, and clamping these portions enables clamping of wiring mother board 70.

While preferred embodiments of the present invention have been described using specific terms, such description is for illustrative purposes only, and it is to be understood that changes and variations may be made without departing from the spirit or scope of the following claims.

What is claimed:

1. A semiconductor device comprising:
    a wiring board including a first surface, a second surface opposite to the first surface, and a connection pad formed on the first surface;
    at least one semiconductor chip mounted over the first surface of the wiring board, and including an electrode that is electrically connected to the connection pad of the wiring board;
    an insulating plastic layer formed on the first surface of the wiring board to encapsulate the semiconductor chip;
    a connection terminal formed on the insulating plastic layer, the connection terminal including an upper surface that is kept uncovered by the insulating plastic layer and a lower surface that is in contact with the insulating plastic layer; and
    a linking interconnect extending from the connection pad, penetrating the insulating plastic layer and reaching the connection terminal.

2. The semiconductor device according to claim 1, wherein the insulating plastic layer comprises an encapsulant covering the semiconductor chip and a protective layer covering the linking interconnect.

3. The semiconductor device according to claim 2, wherein the linking interconnect is disposed between the encapsulant and the protective layer.

4. The semiconductor device according to claim 3, wherein the encapsulant comprises an upper surface and a side surface extending from the upper surface to the first surface, and the linking interconnect is extending along the side surface and the upper surface of the encapsulant from the connection terminal.

5. The semiconductor device according to claim 2, wherein the encapsulant has a rectangular pedestal structure made up a rectangular upper surface and sloping side surfaces extending from each side of the rectangular upper surface and reaching the first surface of the wiring board.

6. The semiconductor device according to claim 2, wherein the protective layer covers the linking interconnect on the first surface of the wiring board that extends from the side surface of the encapsulant and reaches an outer edge of the wiring board.

7. The semiconductor device according to claim 1, wherein the wiring board further includes an external terminal formed on the second surface of the wiring board, the external terminal electrically connected to the connection pad through the wiring that passes between the first surface and the second surface.

8. A semiconductor device comprising:
    a wiring board including a first surface, a second surface opposite to the first surface, and a connection pad formed on the first surface;
    an insulating plastic layer formed on the first surface of the wiring board;
    a semiconductor chip embedded in the insulating plastic layer, and including an electrode that is electrically connected to the connection pad of the wiring board;
    a connection terminal formed on the insulating plastic layer, the connection terminal including an upper surface that is kept uncovered by the insulating plastic layer and a lower surface; and
    a linking interconnect extending from the connection pad, penetrating the insulating plastic layer and reaching the connection terminal.

9. The semiconductor device according to claim 8, wherein the insulating plastic layer comprises an encapsulant covering the semiconductor chip and a protective layer covering the linking interconnect.

10. The semiconductor device according to claim 9, wherein the linking interconnect is disposed between the encapsulant and the protective layer.

11. The semiconductor device according to claim 10, wherein the encapsulant comprises an upper surface and a side surface extending from the upper surface to the first surface, and the linking interconnect is extending along the side surface and the upper surface of the encapsulant from the connection pad.

12. The semiconductor device according to claim 8, wherein the wiring board further includes an external terminal formed on the second surface of the wiring board, the external terminal electrically connected to the connection pad through the wiring that passes between the first surface and the second surface.

13. A semiconductor device comprising:
    a wiring board including a first surface and a second surface opposite to the first surface;
    an insulating plastic layer formed on the first surface of the wiring board;
    a semiconductor chip embedded in the insulating plastic layer and including an electrode;
    a first terminal formed on the insulating plastic layer, the first terminal including an upper surface that is kept uncovered by the insulating plastic layer and a lower surface that is in contact with the insulating plastic layer;
    a linking interconnect extending from a connection pad of the wiring board, penetrating the insulating plastic layer and reaching the first terminal; and
    a plurality of second terminals provided on the second surface of the wiring board and electrically connected respectively to the electrode of the semiconductor chip and the first terminal.

14. The semiconductor device according to claim 13, wherein the plastic layer comprises an encapsulant that covers the semiconductor chip, and a protective layer that covers the linking interconnect.

15. The semiconductor device according to claim 14, wherein the linking interconnect is disposed between the encapsulant and the protective layer.

16. The semiconductor device according to claim 15, wherein the encapsulant comprises an upper surface and a side surface extending from the upper surface to the first surface, and the linking interconnect is extending along the side surface and the upper surface of the encapsulant from the first terminal.

17. The semiconductor device according to claim 13, wherein the wiring board further includes a connection pad formed on the first surface, the electrode of the semiconductor chip being electrically connected to an associated one of the second terminal through the connection pad of the wiring board.

* * * * *